United States Patent
Hinode et al.

(10) Patent No.: US 10,685,829 B2
(45) Date of Patent: Jun. 16, 2020

(54) SUBSTRATE PROCESSING METHOD

(71) Applicant: SCREEN Holdings Co., Ltd., Kyoto (JP)

(72) Inventors: Taiki Hinode, Kyoto (JP); Sadamu Fujii, Kyoto (JP); Rei Takeaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 187 days.

(21) Appl. No.: 15/690,569

(22) Filed: Aug. 30, 2017

(65) Prior Publication Data

US 2018/0061631 A1    Mar. 1, 2018

(30) Foreign Application Priority Data

Aug. 31, 2016   (JP) ................. 2016-170171

(51) Int. Cl.
| | | |
|---|---|---|
| H01L 21/02 | (2006.01) | |
| H01L 21/67 | (2006.01) | |
| H01L 21/687 | (2006.01) | |
| B08B 3/08 | (2006.01) | |
| B08B 7/00 | (2006.01) | |

(52) U.S. Cl.
CPC .......... *H01L 21/02052* (2013.01); *B08B 3/08* (2013.01); *B08B 7/0071* (2013.01); *H01L 21/02057* (2013.01); *H01L 21/67028* (2013.01); *H01L 21/67051* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 2010/0240219 A1 | 9/2010 | Tomita et al. | 438/706 |
| 2012/0260952 A1 | 10/2012 | Nonaka | 134/30 |

(Continued)

FOREIGN PATENT DOCUMENTS

| | | |
|---|---|---|
| JP | 2012-99862 A | 5/2012 |
| JP | 2012-222237 A | 11/2012 |

(Continued)

OTHER PUBLICATIONS

English translation of JP201608227, accessed on May 2019. (Year: 2016).*

*Primary Examiner* — Eric W Golightly
*Assistant Examiner* — Arlyn I Rivera-Cordero
(74) *Attorney, Agent, or Firm* — Ostrolenk Faber LLP

(57) ABSTRACT

A substrate processing method includes a liquid film forming step of forming a liquid film of the low surface tension liquid, an opening-forming step of forming an opening in the center region of the liquid film, a liquid film removal step of removing the liquid film from the upper surface of the substrate by widening the opening, a low surface tension liquid supply step of supplying a low surface tension liquid toward a first liquid landing point which is set on the outside of the opening, a hydrophobic agent supply step of supplying a hydrophobic agent toward a second liquid landing point which is set on the outside of the opening and further from the opening than the first liquid landing point, and a liquid landing point moving step of moving the first liquid landing point and the second liquid landing point so as to follow widening of the opening.

8 Claims, 14 Drawing Sheets

(56) References Cited

U.S. PATENT DOCUMENTS

| | | | |
|---|---|---|---|
| 2013/0133695 A1 | 5/2013 | Minami et al. | 134/18 |
| 2013/0145643 A1 | 6/2013 | Orii et al. | 34/357 |
| 2014/0065295 A1 | 3/2014 | Emoto et al. | 427/8 |
| 2014/0338706 A1 | 11/2014 | Nonaka | 134/30 |
| 2015/0243542 A1* | 8/2015 | Yoshihara | H01L 21/68764 156/345.15 |
| 2015/0318183 A1 | 11/2015 | Ido et al. | |
| 2015/0325458 A1 | 11/2015 | Printz | |
| 2016/0111303 A1 | 4/2016 | Nakamori et al. | |
| 2017/0316961 A1 | 11/2017 | Nakamori et al. | |

FOREIGN PATENT DOCUMENTS

| | | | | |
|---|---|---|---|---|
| JP | 2013-115370 A | 6/2013 | | |
| JP | 2015-115584 A | 6/2015 | | |
| JP | 2016-082223 A | 5/2016 | | |
| JP | 201608227 | * | 5/2016 | B08B 3/04 |
| TW | 201351493 A | 12/2013 | | |
| TW | 201604950 A | 2/2016 | | |
| TW | 201606862 A | 2/2016 | | |
| TW | 201625361 A | 7/2016 | | |

\* cited by examiner

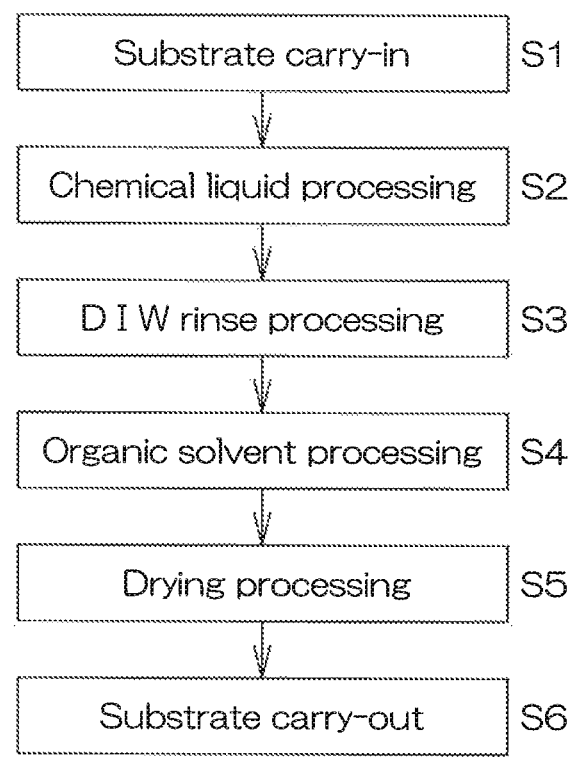

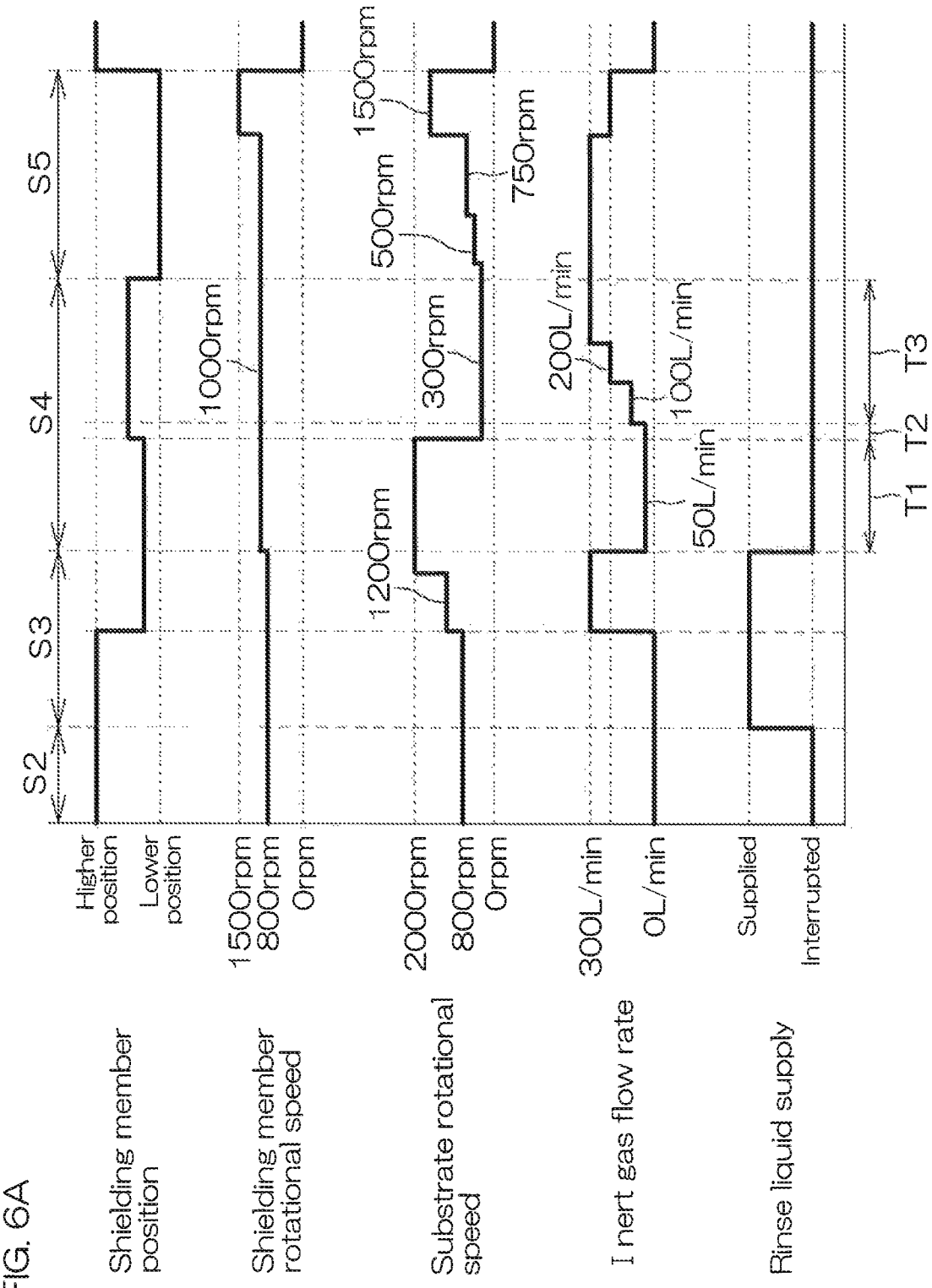

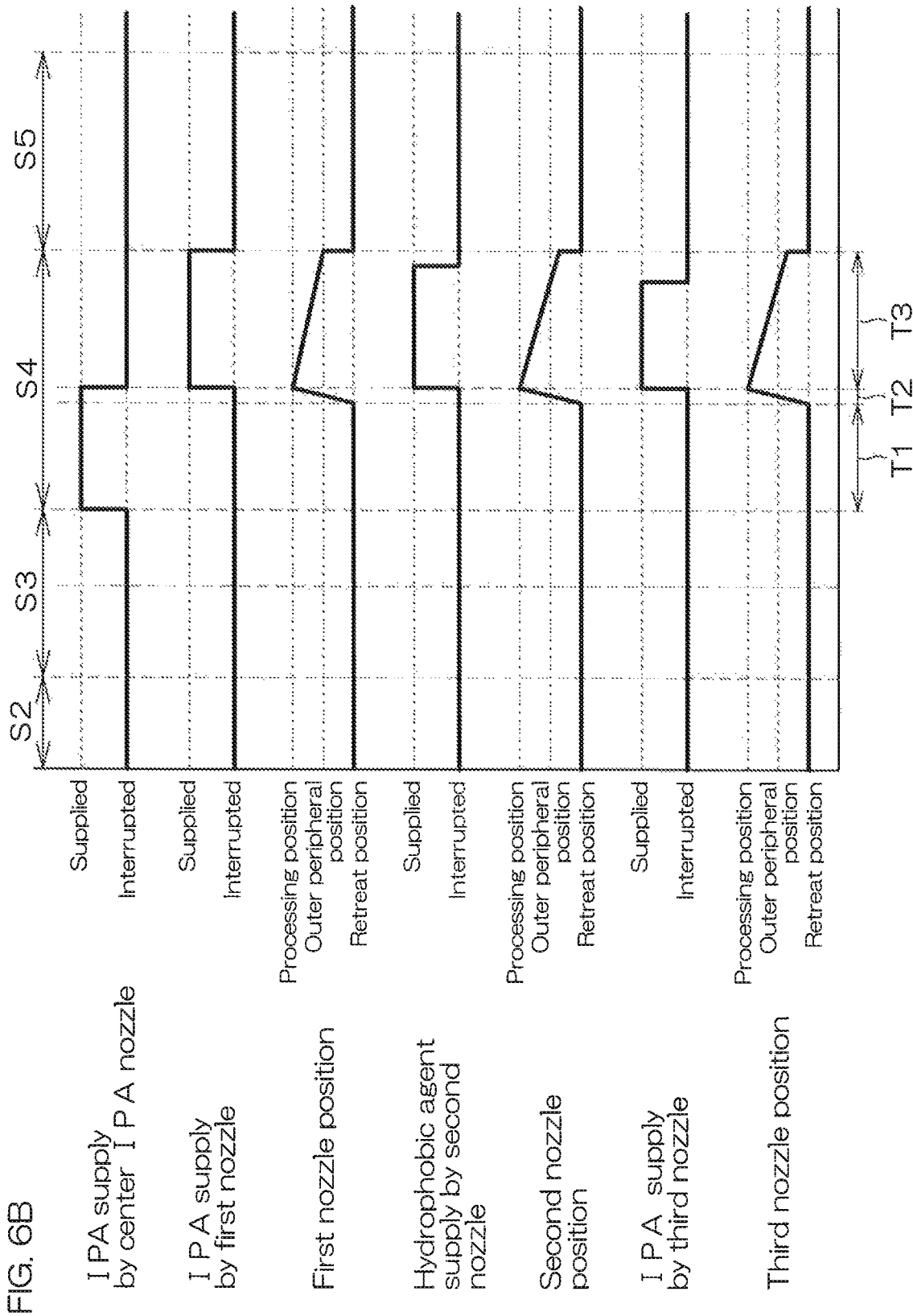

SUBSTRATE PROCESSING METHOD

BACKGROUND OF THE INVENTION

1. Field of the Invention

The present invention relates to a substrate processing method whereby a substrate is processed. Examples of substrates to be processed include substrates such as semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

In substrate processing with a single substrate processing type substrate processing apparatus that processes one substrate at a time, a chemical liquid is supplied to an approximately horizontally held substrate by a spin chuck, for example. A rinse liquid is then supplied to the substrate, whereby the chemical liquid on the substrate is replaced by the rinse liquid. A spin drying step is then carried out to remove the rinse liquid on the substrate.

As shown in FIG. 12, when a fine pattern is formed on the front surface of a substrate, it may be impossible in the spin drying step to remove the rinse liquid that has entered into the interior of the pattern. Drying defects may thereby be produced. A liquid surface of the rinse liquid that has entered into the interior of the pattern (an interface between the air and the liquid) is formed inside the pattern. Consequently, surface tension acts on the liquid at the locations where the liquid surface and the pattern are in contact. When the surface tension is high, the pattern will be more likely to collapse. Water, a typical rinse liquid, has high surface tension. Therefore, collapse of the pattern in the spin drying step cannot be ignored.

It may therefore be considered to supply isopropyl alcohol (IPA), which is a low surface tension liquid with lower surface tension than water, to the substrate to replace the water, which has entered into the interior of the pattern, by the IPA and thereafter eliminate the IPA to dry the upper surface of the substrate. However, even when the water that has entered into the interior of the pattern has been replaced with IPA, the pattern can still undergo collapse when, for example, the surface tension of the IPA continues to apply to the pattern. The IPA must therefore be rapidly removed from the upper surface of the substrate.

On the other hand, U.S. Patent Application Publication No. 2010/240219 discloses substrate processing in which a water-repellent (hydrophobic) protective film with low wettability is formed on the front surface of a substrate. In this substrate processing method, the surface tension of the patterned IPA is reduced by the protective film, and collapse of the pattern can thereby be prevented. Specifically, in this substrate front surface treatment, a protective film is formed by supplying a silane coupling agent near the center of rotation of the front surface of the substrate and spreading the silane coupling agent over the entire region of the front surface of the substrate by the centrifugal force of rotation of the substrate. By then supplying IPA to the center of rotation of the substrate and spreading the IPA over the entire region of the front surface of the substrate by the centrifugal force of rotation of the substrate, the silane coupling agent which remains on the front surface of the substrate, is replaced by the IPA.

SUMMARY OF THE INVENTION

In the substrate front surface treatment described in U.S. Patent Application Publication No. 2010/240219, the silane coupling agent supplied to the substrate front surface undergoes degradation until it is replaced by IPA, and hydrophobicity of the front surface of the substrate may be lowered. This may make it impossible to adequately reduce the surface tension of the IPA that is patterned.

Therefore, an object of the present invention is to provide a substrate processing method that can rapidly replace a hydrophobic agent supplied to the upper surface of the substrate with a low surface tension liquid, and that can rapidly remove the liquid with low surface tension on the upper surface of the substrate.

The present invention provides a substrate processing method comprising a substrate holding step of holding a substrate horizontally, a liquid film forming step of forming a liquid film of a low surface tension liquid having lower surface tension than water by supplying to the upper surface of the horizontally held substrate, an opening-forming step of forming an opening in a center region of the liquid film, a liquid film removal step of removing the liquid film from the upper surface of the horizontally held substrate by widening the opening, a low surface tension liquid supply step of supplying a low surface tension liquid having lower surface tension than water toward a first liquid landing point which is set on the outside of the opening, a hydrophobic agent supply step of supplying a hydrophobic agent that renders the upper surface of the horizontally held substrate hydrophobic, toward a second liquid landing point which is set on the outside of the opening and further from the opening than the first liquid landing point, and a liquid landing point moving step of moving the first liquid landing point and the second liquid landing point so as to follow the widening of the opening.

According to this method, a low surface tension liquid having lower surface tension than water is supplied to the first liquid landing point. The first liquid landing point is set on the outside of the opening formed in the center region of the liquid film. A hydrophobic agent that renders the upper surface of the substrate hydrophobic is supplied to the second liquid landing point. The second liquid landing point is set on a position that is the outside of the opening and is further from the opening than the first liquid landing point. Thus, when the first liquid landing point and the second liquid landing point are moved to follow the widening of the opening, the hydrophobic agent that has been supplied to the second liquid landing point is rapidly replaced by the low surface tension liquid that has been supplied to the first liquid landing point. Moreover, since the low surface tension liquid and the hydrophobic agent can be supplied to the outside of the opening while removing the liquid film from the upper surface of the substrate, it is possible to rapidly remove the low surface tension liquid supplied to the first liquid landing point, from the upper surface of the substrate.

According to the preferred embodiment of the present invention, the liquid landing point moving step includes a step of moving the first liquid landing point so as to follow movement of the second liquid landing point. According to this method, the first liquid landing point is moved so as to follow movement of the second liquid landing point, and the hydrophobic agent that has been supplied to the second liquid landing point is thereby replaced more rapidly by the low surface tension liquid that has been supplied to the first liquid landing point.

According to the preferred embodiment of the present invention, the substrate processing method further includes a substrate rotating step of rotating the horizontally held substrate in parallel with the liquid film removal step. Furthermore, the first liquid landing point is set so as to be positioned on upstream side in the rotational direction of the substrate more than the second liquid landing point.

According to this method, since the first liquid landing point is positioned on upstream side in the rotational direction of the substrate more than the second liquid landing point, the hydrophobic agent that is supplied to the second liquid landing point is rapidly replaced by the low surface tension liquid that is supplied to upstream side in the rotational direction of the substrate more than the second liquid landing point.

According to the preferred embodiment of the present invention, the liquid landing point moving step includes a nozzle moving step in which a support member, that commonly supports both a first nozzle that supplies the low surface tension liquid toward the first liquid landing point and a second nozzle that supplies the hydrophobic agent toward the second liquid landing point, is driven to move the first nozzle and the second nozzle along the upper surface of the horizontally held substrate.

According to this method, the second nozzle that supplies the hydrophobic agent toward the second liquid landing point and the first nozzle that supplies the low surface tension liquid toward the first liquid landing point are both commonly supported by the support member. Control of the location of the first liquid landing point and the second liquid landing point is facilitated, in comparison to the case where each nozzle is supported by a separate member. In addition, the first nozzle and the second nozzle can be moved along the upper surface of the substrate while maintaining a fixed interval between the first liquid landing point and the second liquid landing point. Unevenness in replacement of the hydrophobic agent by the low surface tension liquid can thereby be reduced, in comparison to where the first nozzle and second nozzle are separately moved.

According to the preferred embodiment of the present invention, the substrate processing method further comprises a step of supplying a low surface tension liquid having lower surface tension than water toward a third liquid landing point set on the outside of the opening at a position further from the opening than the second liquid landing point.

According to this method, since the low surface tension liquid is supplied toward the third liquid landing point set on a position outside the opening and further from the opening than the second liquid landing point, liquid film cracking which is occurred by local evaporation of the liquid film before the liquid film is removed by widening of the opening, can be minimized to occur. The liquid film can be thereby removed from the upper surface of the substrate satisfactorily.

According to the preferred embodiment of the present invention, the liquid landing point moving step includes a step of moving the third liquid landing point so as to follow movement of the second liquid landing point. According to this method, moving the third liquid landing point to follow movement of the second liquid landing point can further minimize the liquid film cracking which is occurred by local evaporation of the liquid film before the liquid film is removed by widening of the opening.

According to the preferred embodiment of the present invention, the substrate processing method further includes a substrate heating step of heating the horizontally held substrate. The substrate heating step is initiated before the hydrophobic agent supply step.

According to this method, since the substrate heating step of heating the substrate is initiated before the hydrophobic agent supply step, the hydrophobic agent that has been supplied to the second liquid landing point is rapidly heated. The activity of the hydrophobic agent on the substrate can thereby be increased. By supplying the hydrophobic agent with increased activity to the second liquid landing point, the hydrophobicity on the upper surface of the substrate can be increased.

According to the preferred embodiment of the present invention, the substrate heating step is continued until completion of the low surface tension liquid supply step. According to this method, since the substrate heating step is continued until completion of the low surface tension liquid supply step, evaporation of the low surface tension liquid that has been supplied to the first liquid landing point is accelerated. Widening of the opening is therefore also accelerated. The liquid film can thereby be removed from the upper surface of the substrate more rapidly.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a flow diagram for illustration of an example of substrate processing performed by the substrate processing apparatus.

FIG. 6A to FIG. 6B are time charts for illustration of the details of substrate processing.

DETAILED DESCRIPTION OF THE PREFERRED EMBODIMENTS

First Preferred Embodiment

Figure 1:
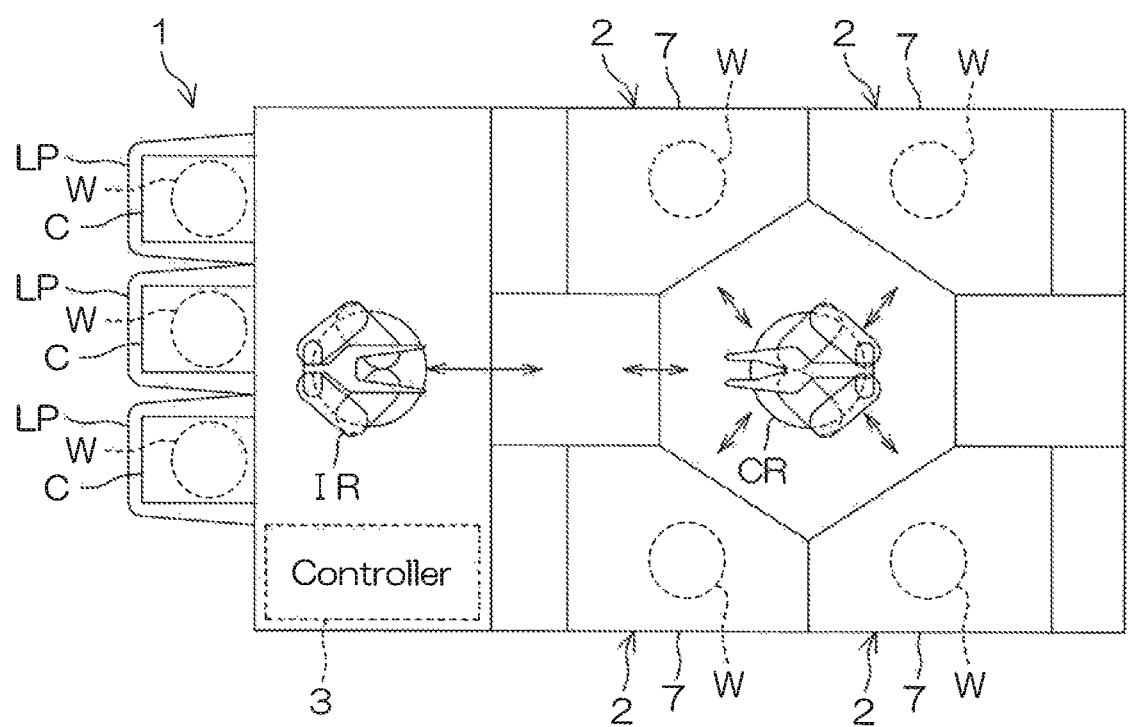
FIG. 1 is an illustrative plan view for describing a layout of the interior of a substrate processing apparatus according to a first preferred embodiment of the present invention.

FIG. 1 is an illustrative plan view for describing a layout of the interior of a substrate processing apparatus 1 according to the first preferred embodiment of the present invention. The substrate processing apparatus 1 is a single substrate processing type apparatus that processes substrates W such as silicon wafers, one by one by a processing liquid. The processing liquid may include a chemical liquid, rinse liquid, organic solvent, hydrophobic agent, etc. For this preferred embodiment, each substrate W is a substrate with a circular shape. A fine pattern is formed on the front surface of the substrate W (see FIG. 12).

The substrate processing apparatus 1 includes a plurality of processing units 2 that are to process substrates W using a processing liquid, a plurality of load ports LP each holding a carrier C that houses a plurality of substrates W to be processed by the processing units 2, transfer robots IR and CR that transport the substrates W between the load ports LP and the processing units 2, and a controller 3 that controls the substrate processing apparatus 1. The transfer robot IR transfers the substrates W between the carriers C and the substrate transfer robot CR. The transfer robot CR transports the substrates W between the transfer robot IR and the processing units 2. The plurality of processing units 2 may have the same configuration, for example.

Figure 2:
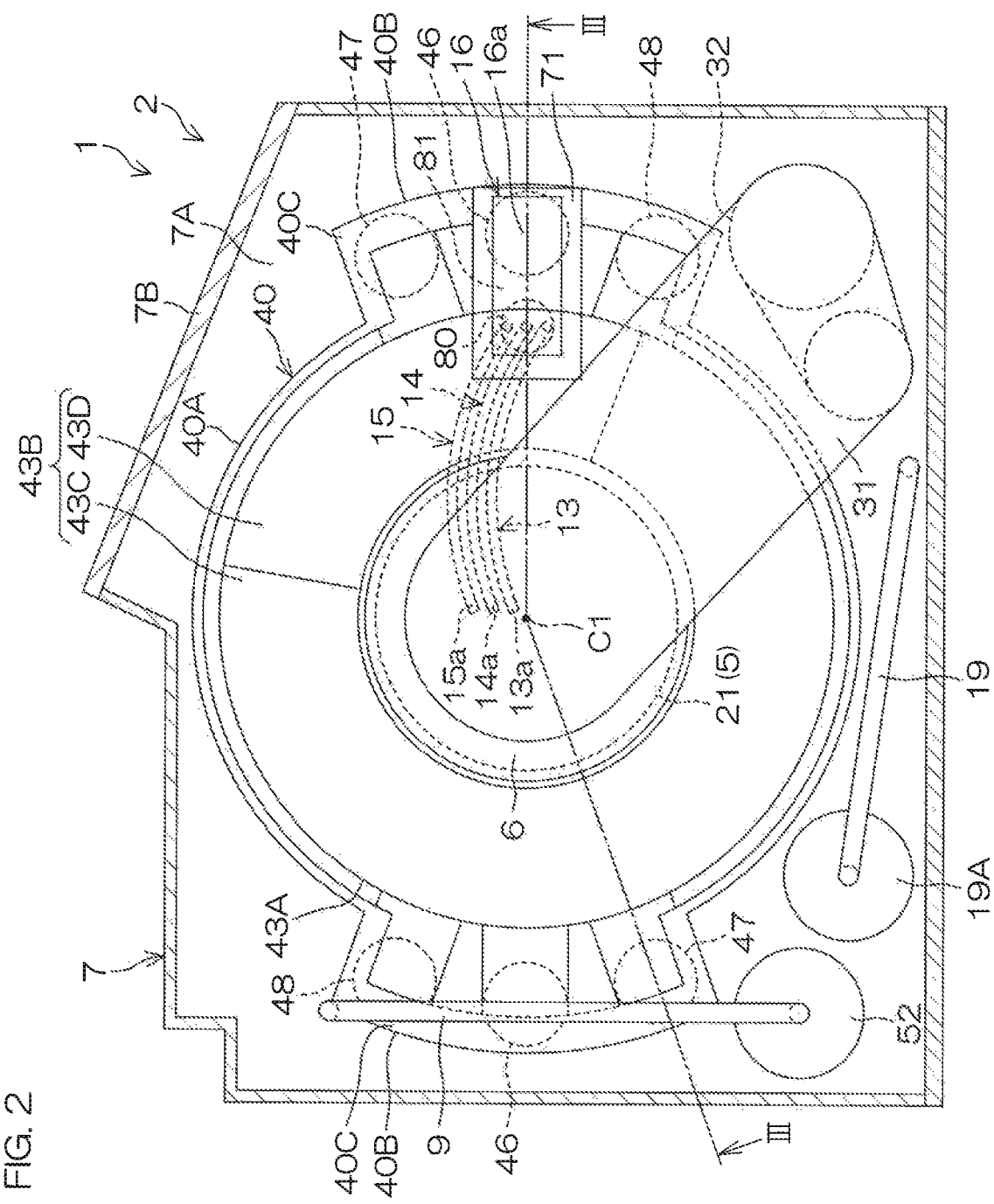
FIG. 2 is an illustrative lateral cross-sectional view serving for illustration of a configuration example of a processing unit included in the substrate processing apparatus.
Figure 3:
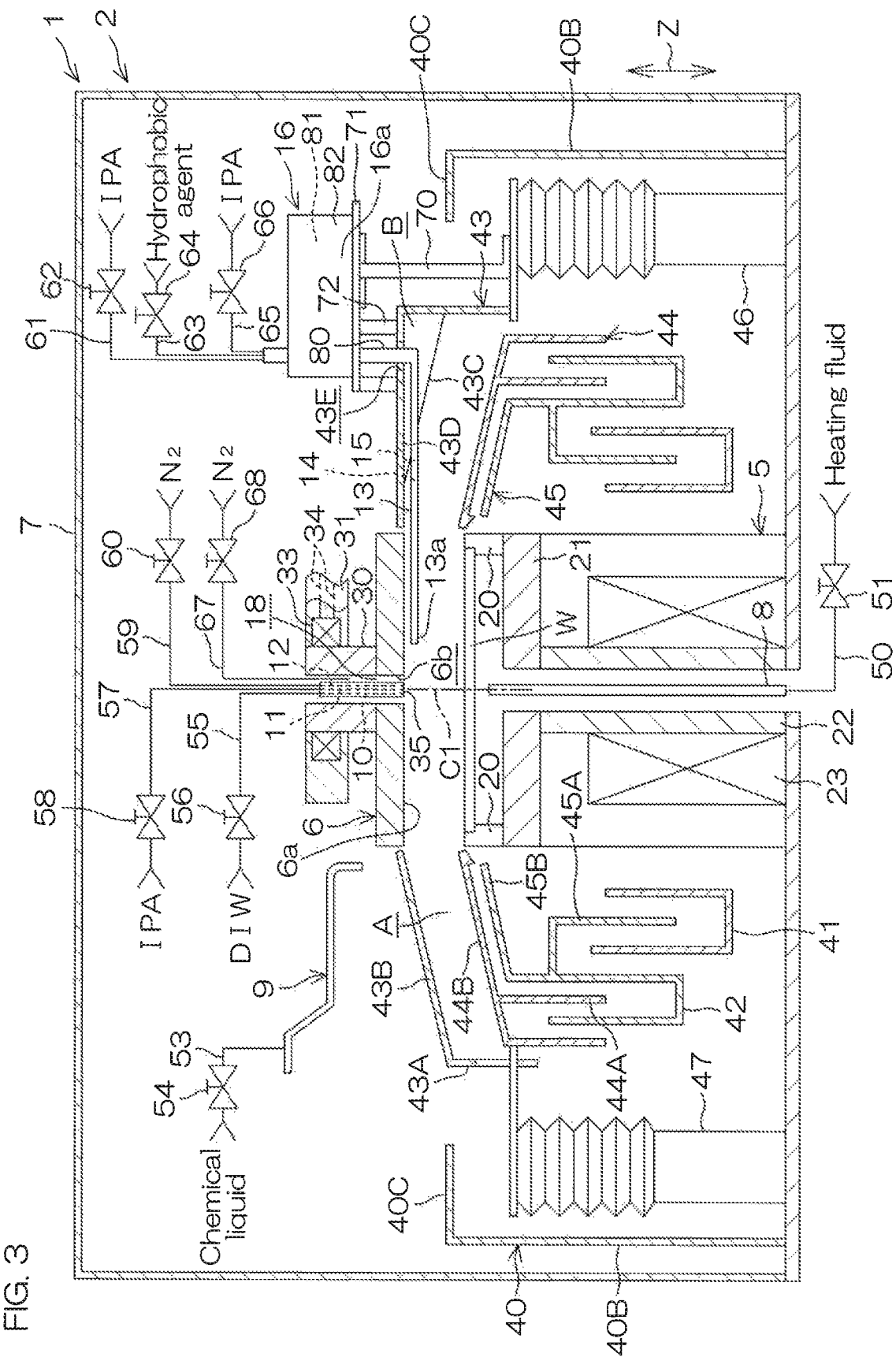
FIG. 3 corresponds to a vertical sectional view taken along line III-III in FIG. 2, and is a schematic view for describing a configuration example of the processing unit.

FIG. 2 is an illustrative cross-sectional view serving for illustration of an arrangement example of a processing unit 2. FIG. 3 corresponds to a vertical sectional view taken along line in FIG. 2, and is a schematic view for describing an arrangement example of the processing unit 2.

The processing unit 2 includes a spin chuck 5 that rotates a single substrate W around a vertical rotational axis C1 running through the center of the substrate W, while holding the substrate W in a horizontal orientation. The spin chuck 5 is an example of a substrate holding unit that holds the substrate W horizontally. The processing unit 2 further includes a shielding member 6 with a facing surface 6a that faces the upper surface of the substrate W (the main surface on the upper side), and a chamber 7 that houses the substrate W for processing the substrate W with a processing liquid. The shielding member 6 is an example of a facing member. In the chamber 7, a carry-in/carry-out port 7A for carrying in and carrying out the substrate W is formed. The chamber 7 includes a shutter unit 7B that opens and closes the carry-in/carry-out port 7A.

The spin chuck 5 includes chuck pins 20, a spin base 21, a rotating shaft 22, and an electric motor 23 that rotates the rotating shaft 22 around the rotational axis C1.

The rotating shaft 22 extends in the vertical direction along the rotational axis C1 (also referred to as the vertical direction Z), and for the preferred embodiment, the rotating shaft 22 is a hollow shaft. The upper end of the rotating shaft 22 is coupled to the center of the lower surface of the spin base 21. The spin base 21 has a disk shape along the horizontal direction. The plurality of chuck pins 20 that grip the substrate W, are disposed at intervals in the circumferential direction at the peripheral edge portion of the upper surface of the spin base 21. The substrate W is rotated around the rotational axis C1 by the rotating shaft 22 being rotated by the electric motor 23. In the following, the inner side in the rotational radius direction of the substrate W shall be referred to simply as "radially inner side," and the outer side in the rotational radius direction of the substrate W shall be referred to simply as "radially outer side."

The shielding member 6 is formed as a discoid shape having approximately the same diameter as the substrate W or a larger diameter than the substrate W. The shielding member 6 is disposed essentially horizontally above the spin chuck 5. A hollow shaft 30 is fixed on the side of the shielding member 6 opposite the facing surface 6a. In the portion of the shielding member 6 including the location overlapping with the rotational axis C1 in plan view, a communicating hole 6b that runs vertically through the shielding member 6 and communicates with the interior space of the hollow shaft 30 is formed.

The processing unit 2 further includes a shielding member support member 31 that extends horizontally and supports the shielding member 6 via the hollow shaft 30, a shielding member raising/lowering mechanism 32 that is connected to the shielding member 6 via the shielding member support member 31 and drives raising and lowering of the shielding member 6, and a shielding member rotating mechanism 33 that rotates the shielding member 6 around the rotational axis C1.

The shielding member raising/lowering mechanism 32 can position the shielding member 6 at any desired position (height) from a lower position to a higher position. The lower position is the position within the movable range of the shielding member 6, at which the facing surface 6a of the shielding member 6 is most proximal to the substrate W. The distance between the upper surface of the substrate W and the facing surface 6a, when the shielding member 6 is positioned at the lower position, is 0.5 mm, for example. The higher position is the position within the movable range of the shielding member 6, at which the facing surface 6a of the shielding member 6 is most distant from the substrate W. The distance between the upper surface of the substrate W and the facing surface 6a, when the shielding member 6 is positioned at the higher position, is 80 mm, for example.

The shielding member rotating mechanism 33 includes an electric motor built into the tip of the shielding member support member 31. A plurality of wirings 34 arranged inside the shielding member support member 31 are connected to the electric motor. The plurality of wirings 34 include a power line for power transmission to the electric motor, and an encoder line for output of rotational information for the shielding member 6. By detecting rotational information of the shielding member 6, the rotation of the shielding member 6 can be controlled accurately.

The processing unit 2 further includes an exhaust bucket 40, surrounding the spin chuck 5, a plurality of cups 41, 42 (a first cup 41 and a second cup 42) that are disposed between the spin chuck 5 and the exhaust bucket 40, and a plurality of guards 43 to 45 (a first guard 43, a second guard 44, and a third guard 45) that receive processing liquid removed off the substrate W from the substrate W held by the spin chuck 5.

Each processing unit 2 also includes a plurality of guard raising/lowering mechanisms 46 to 48 (a first guard raising/lowering mechanism 46, a second guard raising/lowering mechanism 47 and a third guard raising/lowering mechanism 48) that drive raising and lowering of the plurality of guards 43 to 45, respectively. In the present embodiment, each of the guard raising/lowering mechanisms 46 to 48 is provided as pairs so as to be point symmetry around the rotational axis C1 of the substrate W as the center in plan view. The plurality of guards 43 to 45 can thereby be stably raised and lowered respectively.

The exhaust bucket 40 includes a cylinder portion 40A with a circular cylindrical shape, a plurality of projecting portions 40B (two, for the present preferred embodiment) projecting from the cylinder portion 40A to the radially outer side of the cylinder portion 40A, and a plurality of lid portions 40C mounted at upper ends of a plurality of projecting portions 40B. The plurality of guard raising/lowering mechanisms 46 to 48 are disposed at the same positions as the projecting portions 40B in the circumferential direction of the cylinder portion 40A, further to the radially inner side than the projecting portions 40B. Specifically, each composed of a first guard raising/lowering mechanism 46, a second guard raising/lowering mechanism 47 and a third guard raising/lowering mechanism 48 is disposed at the same location as each of the projecting portions 40B, in the circumferential direction of the cylinder portion 40A.

Each of the cups 41, 42 has an annular groove that opens upward. Each of the cups 41, 42 surrounds a spin chuck 5 further to the radially inner side than the cylinder portion 40A of the exhaust bucket 40. The second cup 42 is disposed further to the radially outer side than the first cup 41. The second cup 42 is integral with the third guard 45, for example. The second cup 42 is raised and lowered together with the third guard 45. A recovery piping (not shown) or a waste liquid piping (not shown) is connected to the groove of each cup 41, 42. Processing liquid guided to a bottom portion of each of the cups 41, 42 runs through the recovery piping or the waste liquid piping and is recovered or discarded.

The guards 43 to 45 are disposed so as to surround the spin chuck 5 and the shielding member 6 in plan view.

The first guard 43 includes a first cylindrical portion 43A, surrounding the spin chuck 5 further to the radially inner side than the cylinder portion 40A of the exhaust bucket 40, and a first extension portion 43B extending to the radially inner side from the first cylindrical portion 43A.

The first guard 43 is raised and lowered between a lower position and a higher position by the first guard raising/lowering mechanism 46. The lower position is the position of the first guard 43 when the upper end of the first guard 43 (the radially inner side end) is positioned lower than the substrate W. The higher position is the position of the first guard 43 when the upper end of the first guard 43 (the radially inner side end) is positioned higher than the substrate W. The first guard 43 can be positioned at a shielding member facing position and a substrate facing position between the lower position and the higher position, by raising and lowering by the first guard raising/lowering mechanism 46. When the first guard 43 is positioned at the substrate facing position, the first extension portion 43B (its radially inner side end) faces the substrate W from the horizontal direction. When the first guard 43 is positioned at a shielding member facing position, the first extension portion 43B (its radially inner side end) faces the shielding member 6 from the horizontal direction.

When the first guard 43 is positioned at the shielding member facing position, the first guard 43, together with the substrate W held on the spin chuck 5 and the shielding member 6, can form a space A where movement of the atmosphere in from and out to the outside is restricted. The outside of the space A is the space further above the shielding member 6 and the space further to the radially outer side than the first guard 43. The space A only needs to be formed so that flow of fluid between the atmosphere inside the space A and the atmosphere outside of the space A is restricted, and the atmosphere inside the space A and the outside atmosphere does not necessarily have to be completely shielded.

The second guard 44 includes a second cylindrical portion 44A, surrounding the spin chuck 5 further to the radially inner side than the first cylindrical portion 43A of the first guard 43, and a second extension portion 44B extending to the radially inner side from the second cylindrical portion 44A.

The second guard 44 is raised and lowered between a lower position and a higher position by the second guard raising/lowering mechanism 47. The lower position is the position of the second guard 44 when the upper end of the second guard 44 (the radially inner side end) is positioned lower than the substrate W. The higher position is the position of the second guard 44 when the upper end of the second guard 44 (the radially inner side end) is positioned higher than the substrate W. The second guard 44 can be positioned at a substrate facing position between the lower position and the higher position, by raising and lowering by the second guard raising/lowering mechanism 47. When the second guard 44 is positioned at the substrate facing position, the second extension portion 44B (its radially inner side end) faces the substrate W from the horizontal direction. The second extension portion 44B faces the first extension portion 43B from below. The space A is partitioned from below by the second guard 44, when the second guard 44 is positioned at the substrate facing position.

The third guard 45 includes a third cylindrical portion 45A, surrounding the spin chuck 5 further to the radially inner side than the second cylindrical portion 44A of the second guard 44, and a third extension portion 45B extending to the radially inner side from the third cylindrical portion 45A. The third extension portion 45B faces the second extension portion 44B from below.

The third guard 45 is raised and lowered between a lower position and a higher position by the third guard raising/lowering mechanism 48 (see FIG. 2). The lower position is the position of the third guard 45 when the upper end of the third guard 45 (the radially inner side end) is positioned lower than the substrate W. The higher position is the position of the third guard 45 when the upper end of the third guard 45 (the radially inner side end) is positioned higher than the substrate W. The third guard 45 can be positioned at a substrate facing position between the lower position and the higher position, by raising and lowering by the third guard raising/lowering mechanism 48. When the third guard 45 is positioned at the substrate facing position, the third extension portion 45B (its radially inner side end) faces the substrate W from the horizontal direction.

The processing unit 2 includes a lower surface nozzle 8 that supplies a heating fluid to the lower surface of the substrate W, and a chemical liquid nozzle 9 that supplies a chemical liquid such as hydrofluoric acid to the upper surface of the substrate W.

The lower surface nozzle 8 is inserted through the rotating shaft 22. The lower surface nozzle 8 has, at its upper end, a discharge port facing the center of the lower surface of the substrate W. A heating fluid such as hot water is supplied from a heating fluid supply source to the lower surface nozzle 8 via a heating fluid supply pipe 50. The heating fluid supply pipe 50 has interposed therein a heating fluid valve 51 that opens and closes its flow passage. The hot water is water at a higher temperature than room temperature, such as 80° C. to 85° C. The heating fluid is not limited to hot water and may be a gas, such as high-temperature nitrogen gas, or any fluid that can heat the substrate W.

The chemical liquid is supplied to the chemical liquid nozzle 9 from the chemical liquid supply source, via the chemical liquid supply pipe 53. The chemical liquid supply pipe 53 has interposed therein a chemical liquid valve 54 that opens and closes its flow passage.

The chemical liquid is not limited to hydrofluoric acid, and may be a liquid including at least one from among sulfuric acid, acetic acid, nitric acid, hydrochloric acid, hydrofluoric acid, ammonia water, hydrogen peroxide water, organic acids (such as citric acid or oxalic acid), organic alkalis (such as TMAH: tetramethylammonium hydroxide), surfactants and corrosion inhibitors. Examples of chemical liquids containing mixtures of these include SPM (sulfuric acid/hydrogen peroxide mixture) and SC1 (ammonia-hydrogen peroxide mixture).

The chemical liquid nozzle 9 moves in the vertical direction and the horizontal direction by a chemical liquid nozzle moving mechanism 52 (see FIG. 2). The chemical liquid nozzle 9 is moved between a center position and a retreat position by movement in the horizontal direction. The center position is the position where the chemical liquid nozzle 9 faces the rotation center position of the upper surface of the substrate W. The retreat position is the retreat position where the chemical liquid nozzle 9 does not face the upper surface of the substrate W. The rotation center position of the upper surface of the substrate W is the position of the upper surface of the substrate W that crosses with the rotational axis C1. The retreat position is the position on the outer side of the spin base 21 in plan view.

The processing unit 2 further includes a DIW nozzle 10, supplying deionized water (DIW) as a rinse liquid to a center region of the upper surface of the substrate W, a central IPA nozzle 11, supplying IPA as an organic solvent to the center region of the upper surface of the substrate W, and an inert gas nozzle 12, supplying nitrogen gas (N2) or another inert gas to the center region of the upper surface of the substrate W. The center region of the upper surface of the substrate W is the region around the center of the upper surface of the substrate W, including the location of the upper surface of the substrate W that crosses with the rotational axis C1.

According to the preferred embodiment, the nozzles 10 to 12 are housed in common in a nozzle housing member 35 that is inserted through the interior space of the hollow shaft 30 and the communicating hole 6b of the shielding member 6, and can discharge of the DIW, IPA and inert gas, respectively. The tips of each of the nozzles 10 to 12 are disposed at heights approximately equal to the facing surface 6a of the shielding member 6. Each of the nozzles 10 to 12 can supply DIW, IPA and inert gas, respectively, to the center region of the upper surface of the substrate W, even when the space A has been formed.

DIW is supplied to the DIW nozzle 10 from the DIW supply source, via a DIW supply pipe 55. The DIW supply pipe 55 has interposed therein a DIW valve 56 that opens and closes its flow passage.

The DIW nozzle 10 may also be a rinse liquid nozzle that supplies a rinse liquid other than DIW. Examples of rinse liquids other than DIW include carbonated water, electrolyzed ion water, ozone water, aqueous hydrochloric acid solutions of dilute concentration (such as approximately 10 to 100 ppm) and reduced water (hydrogen water).

IPA is supplied to the central IPA nozzle 11 from an IPA supply source, via a central IPA supply pipe 57. The central IPA supply pipe 57 has interposed therein a central IPA valve 58 that opens and closes its flow passage.

According to this preferred embodiment, the central IPA nozzle 11 is configured to supply IPA. The central IPA nozzle 11 only needs to function as a central low surface tension liquid nozzle that supplies a low surface tension liquid of lower surface tension than water to the center region of the upper surface of the substrate W.

Figure 12:
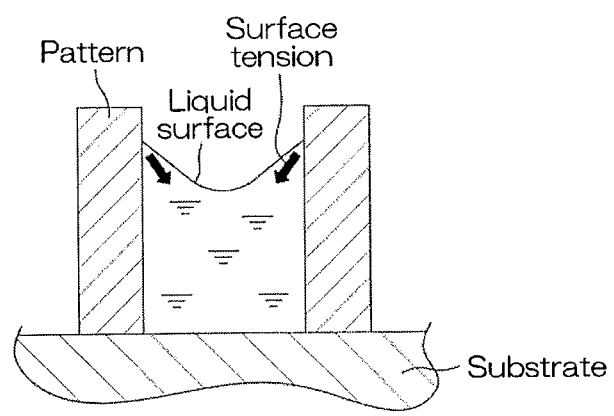
FIG. 12 is an illustrative cross-sectional view for describing principles of pattern collapse due to surface tension.

The low surface tension liquid used may be an organic solvent other than IPA that does not chemically react (has low reactivity) with the upper surface of the substrate W and the pattern that is formed on the substrate W (see FIG. 12). More specifically, a solution including at least one from among IPA, HFE (hydrofluoroether), methanol, ethanol, acetone and trans-1,2-dichloroethylene may be used as the low surface tension liquid. In addition, the low surface tension liquid does not need to be composed of only a single component, and may be a liquid mixture with other components. For example, it may be a mixture of an IPA solution and purified water, or a mixture of an IPA solution and an HFE solution.

An inert gas such as nitrogen gas is supplied to the inert gas nozzle 12 from an inert gas supply source, via a first inert gas supply pipe 59. The first inert gas supply pipe 59 has interposed therein a first inert gas valve 60 that opens and closes its flow passage. The inert gas is not limited to nitrogen gas but may be any gas that is inert to the upper surface of the substrate W and the pattern, and the inert gas may be a rare gas such as argon, for example.

The space between the outer peripheral surface of the nozzle housing member 35 and the inner peripheral surface of the hollow shaft 30 and the sides partitioning the communicating hole 6b in the shielding member 6, forms an inert gas flow channel 18 through which the inert gas is supplied to the center region of the substrate W. In the inert gas flow channel 18, an inert gas such as nitrogen gas is supplied from an inert gas supply source, via a second inert gas supply pipe 67. The second inert gas supply pipe 67 has interposed therein a second inert gas valve 68 arranged to open and close its flow passage. The inert gas supplied to the inert gas flow channel 18 is discharged from the bottom end of the communicating hole 6b toward the upper surface of the substrate W.

The processing unit 2 may further include a moving nozzle 19 that supplies processing liquid to the upper surface of the substrate W (see FIG. 2). The moving nozzle 19 is moved in the vertical direction and the horizontal direction by a moving nozzle moving mechanism 19A. The processing liquid supplied from the moving nozzle 19 to the substrate W is, for example, a chemical liquid, rinse liquid, low surface tension liquid or hydrophobic agent.

The processing unit 2 further includes a first nozzle 13 that supplies a low surface tension liquid such as IPA to the upper surface of the substrate W, a second nozzle 14 that supplies a hydrophobic agent that renders the upper surface of the substrate W hydrophobic to a location on the upper surface of the substrate W other than that of the first nozzle 13, and a third nozzle 15 that supplies a low surface tension liquid such as IPA to a location of the upper surface of the substrate W other than that of the first nozzle 13 or second nozzle 14 (see FIG. 2).

The first nozzle 13 and the third nozzle 15 are each examples of low surface tension liquid supply units that supply a low surface tension liquid to the upper surface of the substrate W. The second nozzle is an example of a hydrophobic agent supply unit that supplies a hydrophobic agent to the upper surface of the substrate W.

The nozzles 13 to 15 extend from the inner wall of the first guard 43, so as to be situated in the space A when the space A has been formed. The low surface tension liquid supplied from the third nozzle 15 preferably has affinity with both the hydrophobic agent and the rinse liquid.

The hydrophobic agent is, for example, a silicon hydrophobic agent that can hydrophobicize silicon itself and silicon-containing compounds, or a metal hydrophobic agent that hydrophobicize metals themselves and metal-containing compounds. A metal hydrophobic agent includes, for example, at least one amine that has a hydrophobic group and an organic silicon compound. The silicon hydrophobic agent is, for example, a silane coupling agent. The silane coupling agent includes at least one compound from among, for example, HMDS (hexamethyldisilazane), TMS (tetramethylsilane), fluorinated alkylchlorosilanes, alkyldisilazanes and non-chloro-based hydrophobic agents. A non-chloro-based hydrophobic agent includes at least one from among, for example, dimethylsilyldimethylamine, dimethylsilyldiethylamine, hexamethyldisilazane, tetramethyldisilazane, bis(dimethylamino)dimethylsilane, N, N-dimethylaminotrimethylsilane, N-(trimethylsilyl)dimethylamine and organosilane compounds.

IPA is supplied to the first nozzle 13 from an IPA supply source, via a first IPA supply pipe 61. The first IPA supply pipe 61 has interposed therein a first IPA valve 62 that opens and closes its flow passage. The hydrophobic agent is supplied to the second nozzle 14 from a hydrophobic agent supply source, via a hydrophobic agent supply pipe 63. The hydrophobic agent supply pipe 63 has interposed therein a hydrophobic agent valve 64 that opens and closes its flow passage. IPA is supplied to the third nozzle 15 from an IPA supply source, via a second IPA supply pipe 65. The second IPA supply pipe 65 has interposed therein a second IPA valve 66 that opens and closes its flow passage.

Referring to FIG. 2, the nozzles 13 to 15 extend in the horizontal direction and are curved in plan view. Specifically, the nozzles 13 to 15 may have circular arc shapes that follow the first cylindrical portion 43A of the first guard 43. A discharge port 13a that discharges IPA in the vertical direction (downward) toward the upper surface of the substrate W is provided in the tip of the first nozzle 13. A discharge port 14a that discharges a hydrophobic agent in the vertical direction (downward) toward the upper surface of the substrate W is provided in the tip of the second nozzle 14. A discharge port 15a that discharges IPA in the vertical direction (downward) toward the upper surface of the substrate W is provided in the tip of the third nozzle 15.

The first nozzle 13, second nozzle 14 and third nozzle 15 are disposed in that order from the radially inner side toward the radially outer side. The discharge port 13a of the first nozzle 13 is positioned nearer the rotation center position (the radially inner side) of the upper surface of the substrate W than the discharge port 14a of the second nozzle 14. The discharge port 14a of the second nozzle 14 is positioned nearer the rotation center position (the radially inner side) of the upper surface of the substrate W than the discharge port 15a of the third nozzle 15.

Referring to FIG. 3, the processing unit 2 further includes a nozzle moving mechanism 16 connected to the first guard 43, that moves the nozzles 13 to 15 in the horizontal direction between the upper surface of the substrate W and the facing surface 6a of the shielding member 6.

The nozzles 13 to 15 are moved between the center position and the retreat position by the nozzle moving mechanism 16. The center position of the first nozzle 13 is the position where the first nozzle 13 faces the rotation center position of the upper surface of the substrate W. The center position of the second nozzle 14 is the position where the second nozzle 14 faces the rotation center position of the upper surface of the substrate W. The center position of the third nozzle 15 is the position where the third nozzle 15 faces the rotation center position of the upper surface of the substrate W.

The retreat position of the first nozzle 13 is the position where the first nozzle 13 does not face the upper surface of the substrate W. The retreat position of the second nozzle 14 is the position where the second nozzle 14 does not face the upper surface of the substrate W. The retreat position of the third nozzle 15 is the position where the third nozzle 15 does not face the upper surface of the substrate W. The retreat position is the position on the outer side of the spin base 21 in plan view. The retreat position of the third nozzle 15 may also be the position of the first guard 43 adjacent to the first cylindrical portion 43A from the radially inner side.

The nozzle moving mechanism 16 includes a support member 80 that commonly supports the nozzles 13 to 15, a driving mechanism 81 that is connected to the first guard 43 and drives the support member 80, and a cover 82 that covers at least a portion of the driving mechanism 81. The driving mechanism 81 includes a rotating shaft (not shown) and a driving motor (not shown) that rotates the rotating shaft. The support member 80 has the form of a rotating shaft that is driven by the driving motor to rotate around a prescribed central axis.

The upper end of the support member 80 is positioned higher than the cover 82. The nozzles 13 to 15 and the support member 80 may also be formed in an integral manner. The support member 80 and the nozzles 13 to 15 have the form of hollow shafts. The interior space of the support member 80 and the interior spaces of each of the nozzles 13 to 15 are connected. The first IPA supply pipe 61, the hydrophobic agent supply pipe 63 and the second IPA supply pipe 65 are inserted into the support member 80 from upper side.

The first extension portion 43B of the first guard 43 integrally includes an inclined section 43C that is inclined with respect to the horizontal direction, and a flat section 43D that is flat in the horizontal direction. The flat section 43D and the inclined section 43C are disposed side by side in the rotational direction of the substrate W (see FIG. 2). The flat section 43D protrudes higher than the inclined section 43C, so as to be positioned higher than the inclined section 43C as it approaches the radially outer side. The flat section 43D is disposed so as to be overlapping with the support member 80 and with the first nozzle 13 that is located outside of the spin base 21 in plan view. The flat section 43D only needs to be disposed so as to overlap at least with the nozzles 13 to 15 that are in the retreat position and the support member 80 in plan view.

The second extension portion 44B of the second guard 44 faces the flat section 43D from lower side. Between the first guard 43 and the second guard 44, there is formed a housing space B that is able to house the first nozzle 13. The housing space B extends in the rotational direction of the substrate W following the first cylindrical portion 43A of the first guard 43, and the housing space B has a circular arc shape in plan view. The housing space B is a space partitioned by the first cylindrical portion 43A, the flat section 43D and the second extension portion 44B. Specifically, the housing space B is partitioned from the radially outer side by the first cylindrical portion 43A, is partitioned from upper side by the flat section 43D, and is partitioned from lower side by the second extension portion 44B. The first nozzle 13 which is positioned at the retreat position is adjacent to the flat section 43D from lower side, in a state of where the first nozzle 13 is housed in the housing space B. The second extension portion 44B is inclined with respect to the horizontal direction, so as to rise upward as the second extension portion 44B goes toward the radially inner side. Thus, the housing space B is maintained even when the second extension portion 44B is adjacent to the first extension portion 43B from lower side.

A penetrating hole 43E running through the flat section 43D in the vertical direction Z is formed in the flat section 43D of the first guard 43. The support member 80 is inserted in the penetrating hole 43E. A sealing member made of rubber, etc., (not shown) is disposed between the support member 80 and the inner wall of the penetrating hole 43E. The region between the support member 80 and the inner wall of the penetrating hole 43E is thereby sealed. The driving mechanism 81 is disposed outside of the space A.

The processing unit 2 further includes a first bracket 70 that is mounted on the first guard raising/lowering mechanism 46 and anchors the nozzle moving mechanism 16 to the first guard 43, a pedestal 71 that is supported by the first bracket 70 and fixedly mounts the driving mechanism 81, and a second bracket 72 that is connected to the first guard 43 and supports the pedestal 71 further toward the radially inner side of the substrate W than the first bracket 70. In the nozzle moving mechanism 16, the portion 16a that is fixed by the first bracket 70 overlaps with the first guard raising/lowering mechanism 46 in plan view.

Figure 4:
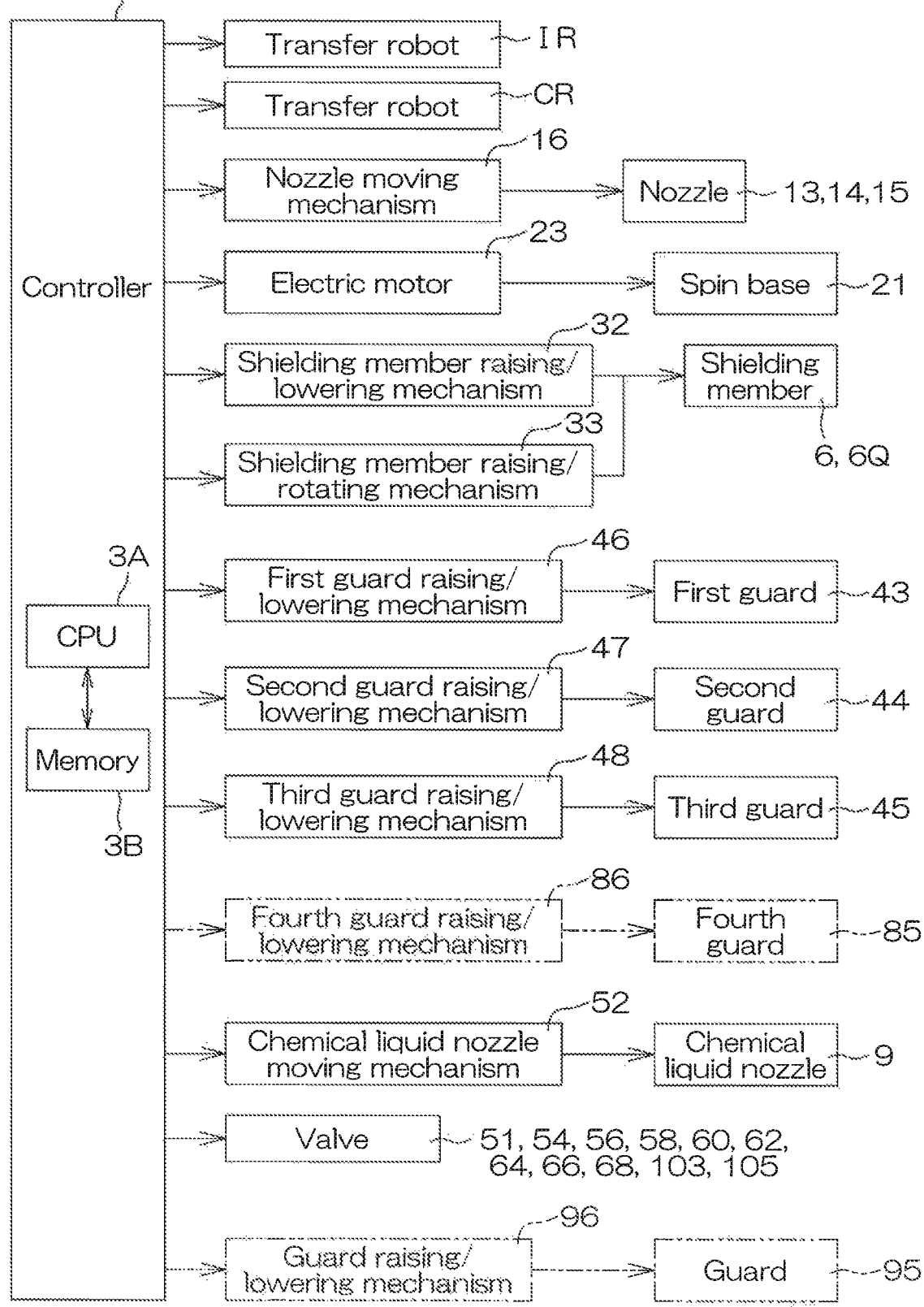
FIG. 4 is a block diagram for illustration of an electrical configuration of the main portion of the substrate processing apparatus.

FIG. 4 is a block diagram for describing the electrical configuration of the main portion of a substrate processing apparatus 1. The controller 3 has a microcomputer, and it controls control objects included in the substrate processing apparatus 1, according to a prescribed control program. More specifically, the controller 3 includes a processor (CPU) 3A and a memory 3B in which a control program has been stored, the processor 3A executing the control program to execute various controls for the substrate processing. In particular, the controller 3 controls movements of the transfer robots IR and CR, the nozzle moving mechanism 16, the electric motor 23, the shielding member raising/lowering mechanism 32, the shielding member rotating mechanism 33, the guard raising/lowering mechanisms 46 to 48, the chemical liquid nozzle moving mechanism 52 and the valves 51, 54, 56, 58, 60, 62, 64, 66, 68.

FIG. 5 is a flow diagram for describing an example of substrate processing performed by the substrate processing apparatus 1, mainly showing the processing realized by the controller 3 executing an operation program. FIG. 6A and FIG. 6B are time charts for illustration of the details of substrate processing.

In substrate processing by the substrate processing apparatus 1, carry-in of a substrate (S1), chemical liquid processing (S2), DIW rinse processing (S3), organic solvent processing (S4), drying processing (S5), and carry-out of the substrate (S6) are executed in that order as shown in FIG. 5, for example.

First, in the substrate processing by the substrate processing apparatus 1, an unprocessed substrate W is carried from the carrier C into a processing unit 2 and transferred to the spin chuck 5 by the transfer robots IR and CR (S1). The substrate W is subsequently held horizontal by the spin chuck 5 until it is carried out by the transfer robot CR (substrate holding step). The upper surface of the substrate W faces the facing surface 6a of the shielding member 6, while the substrate W is held horizontal by the spin chuck 5.

Next, the chemical liquid processing (S2) will be described. After the transfer robot CR has retreated out of the processing unit 2, the chemical liquid processing (S2) is carried out, whereby the upper surface of the substrate W is cleaned with the chemical liquid.

Specifically, referring to FIG. 6A and FIG. 6B, the controller 3 first controls the nozzle moving mechanism 16 to position the nozzles 13 to 15 at the retreat positions. The controller 3 also controls the shielding member raising/lowering mechanism. 32 to dispose the shielding member 6 at the higher position.

Moreover, the controller 3 drives the electric motor 23 to rotate the spin base 21 at 800 rpm, for example. The horizontally held substrate W is thereby rotated (substrate rotating step). The controller 3 controls the shielding member rotating mechanism 33 to rotate the shielding member 6. In this case, the shielding member 6 may be rotated in synchronization with the spin base 21. The phrase "rotates in synchronization" means rotations in the same direction at the same rotational speed.

The controller 3 also controls the chemical liquid nozzle moving mechanism 52 to dispose the chemical liquid nozzle 9 at the chemical liquid processing position above the substrate W. When the chemical liquid nozzle 9 is located at the chemical liquid processing position, the chemical liquid discharged from the chemical liquid nozzle 9 may be landed on the center of rotation of the upper surface of the substrate W. The controller 3 also opens the chemical liquid valve 54. The chemical liquid is thereby supplied from the chemical liquid nozzle 9 toward the rotating upper surface of the substrate W. The supplied chemical liquid is spread over the entire upper surface of the substrate W by centrifugal force. The amount of chemical liquid supplied from the chemical liquid nozzle 9 (the chemical liquid supply amount) is 2 liter/min, for example.

The controller 3 controls the guard raising/lowering mechanisms 46 to 48 to dispose the third guard 45 higher than the substrate facing position. Consequently, the chemical liquid that has splashed outside the substrate due to centrifugal force passes under the third extension portion 45B of the third guard 45, and is received by the third cylindrical portion 45A of the third guard 45. The chemical liquid received by the third cylindrical portion 45A flows to the first cup 41 (see FIG. 3).

Next, the DIW rinse processing (S3) will be described. After the chemical liquid processing (S2) for a fixed time period, the DIW rinse processing (S3) is carried out, whereby the chemical liquid is removed from the upper surface of the substrate W by replacing chemical liquid with the DIW.

Specifically, the controller 3 closes the chemical liquid valve 54. The controller 3 then controls the chemical liquid nozzle moving mechanism. 52 to cause the chemical liquid nozzle 9 to retreat from above the substrate W to the side of the spin base 21.

The controller 3 also opens the DIW valve 56. The DIW is thereby supplied from the DIW nozzle 10 toward the rotating upper surface of the substrate W. The supplied DIW is spread over the entire upper surface of the substrate W by centrifugal force. The chemical liquid on the substrate W is washed off by the DIW. The amount of DIW supplied from the DIW nozzle 10 (the DIW supply amount) is 2 liter/min, for example.

The controller 3 controls the shielding member raising/lowering mechanism 32 to maintain a state with the shielding member 6 positioned at the higher position. Moreover, the controller 3 drives the electric motor 23 to rotate the spin base 21 at 800 rpm, for example.

The controller 3 then controls the electric motor 23 to rotate the spin base 21 at 1200 rpm, for example, and maintain the rotation of the spin base 21 at 1200 rpm for a prescribed time period, and to then accelerate rotation of the spin base 21 to 2000 rpm, for example (high-speed rotation step).

The controller 3 controls the shielding member rotating mechanism 33 to rotate the shielding member 6 at a speed different from the spin base 21. Specifically, the shielding member 6 is rotated at 800 rpm, for example.

The controller 3 also opens the heating fluid valve 51 to supply a heating fluid from the lower surface nozzle 8, and thereby heats the substrate W (substrate heating step).

The controller 3 also opens the second inert gas valve 68 to supply inert gas from the inert gas flow channel 18 toward the upper surface of the substrate W.

When the DIW is supplied from the DIW nozzle 10 toward the rotating upper surface of the substrate W, the controller 3 controls the shielding member raising/lowering mechanism 32 to move the shielding member 6 from the higher position to a first proximal position. The first proximal position is a position where the facing surface 6a of the shielding member 6 is proximal to the upper surface of the substrate W, and is a position such that the distance between the upper surface of the substrate W and the facing surface 6a is 7 mm, for example.

While the shielding member 6 is at the first proximal position, the controller 3 also controls the first guard raising/lowering mechanism 46 to lower the first guard 43 from its position during the chemical liquid processing (S2), to dispose the first guard 43 at the shielding member facing position. A space A is thereby formed by the substrate W, the shielding member 6 and the first guard 43 (space forming step).

The controller 3 may control the second inert gas valve 68 to adjust the flow rate of inert gas supplied from the inert gas flow channel 18 to 300 liter/min, for example. The atmosphere in the space A is replaced with inert gas by supply of the inert gas from the inert gas flow channel 18 (inert gas replacement step). In addition, the controller 3 controls the second guard raising/lowering mechanism 47 to lower the second guard 44 and dispose the second guard 44 at the substrate facing position. The space A is thereby partitioned from below by the second extension portion 44B of the second guard 44. The controller 3 also controls the third guard raising/lowering mechanism 48 to dispose the third guard 45 lower than the substrate facing position.

The DIW that has splashed outside the substrate W by centrifugal force passes between the first extension portion 43B of the first guard 43 and the second extension portion 44B of the second guard 44, and is received by the first cylindrical portion 43A of the first guard 43. Different from this preferred embodiment, the configuration may be such that the chemical liquid that has splashed outside the substrate by centrifugal force is received by the second cylindrical portion 44A of the second guard 44. In this case, so as to pass between the second extension portion 44B of the second guard 44 and the third extension portion 45B of the third guard 45 and to be received by the second cylindrical portion 44A of the second guard 44, the controller 3 controls the guard raising/lowering mechanisms 46 to 48 to dispose the second guard 44 higher than the substrate facing position and dispose the third guard 45 lower than the substrate facing position.

Next, the organic solvent processing (S4) will be explained. After carrying out the DIW rinse processing (S3) for a fixed time period, organic solvent processing (S4) is carried out, in which the DIW on the substrate W is replaced with an organic solvent (for example, IPA) as a low surface tension liquid having lower surface tension than water. While the organic solvent processing (S4) is being carried out, the substrate W continues to be heated (substrate heating step). Specifically, the controller 3 maintains the open state of the heating fluid valve 51. Supply of the heating fluid from the lower surface nozzle 8 is thereby continued, so that heating of the substrate W is continued.

Figure 7A:
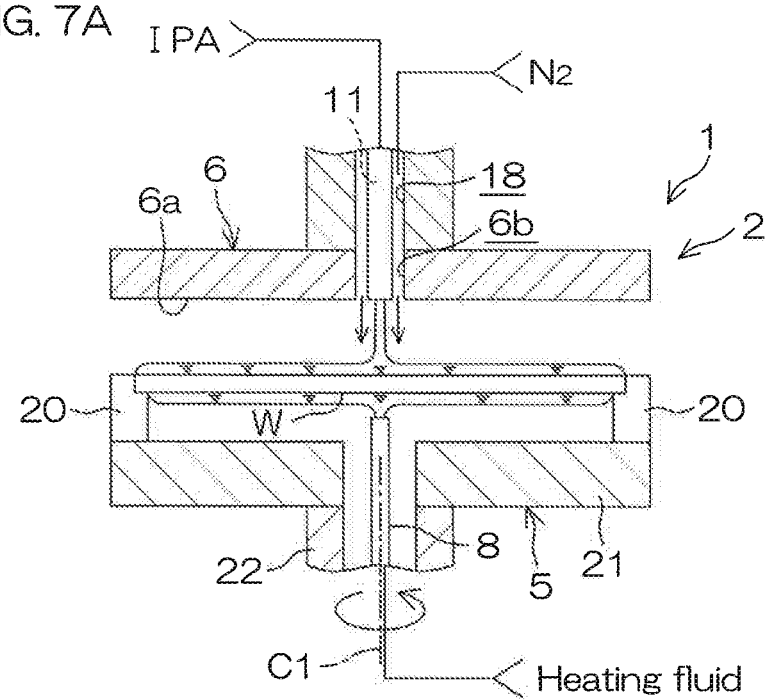
FIG. 7A to FIG. 7C are illustrative cross-sectional views for describing the details of organic solvent processing (S4 in FIG. 5).
Figure 7B:
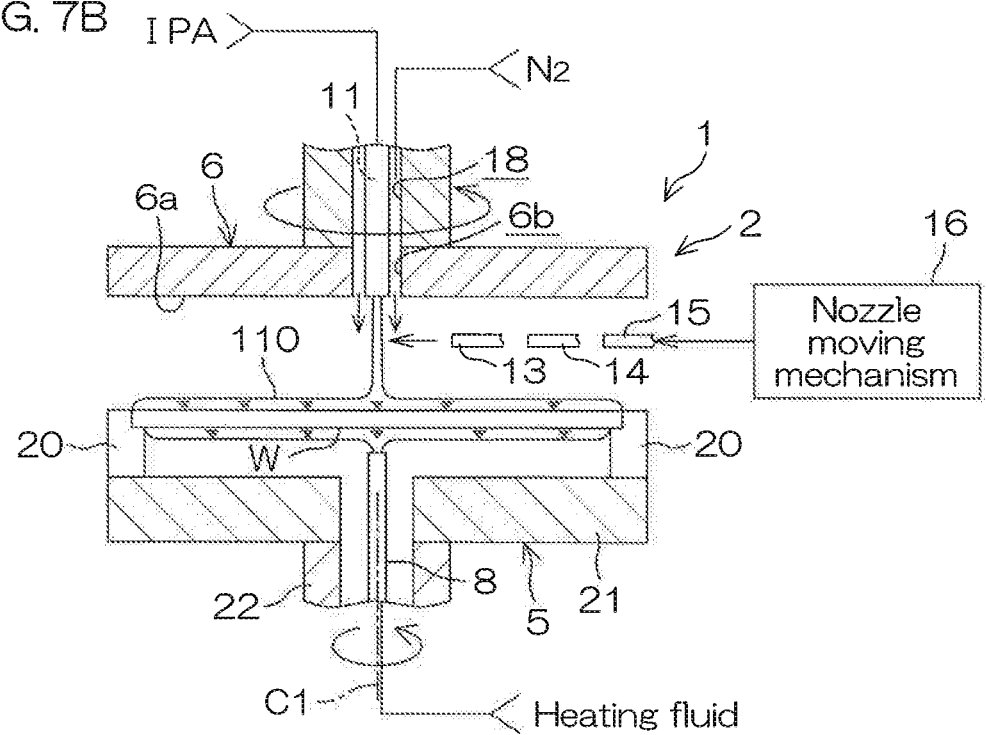
Figure 7C:
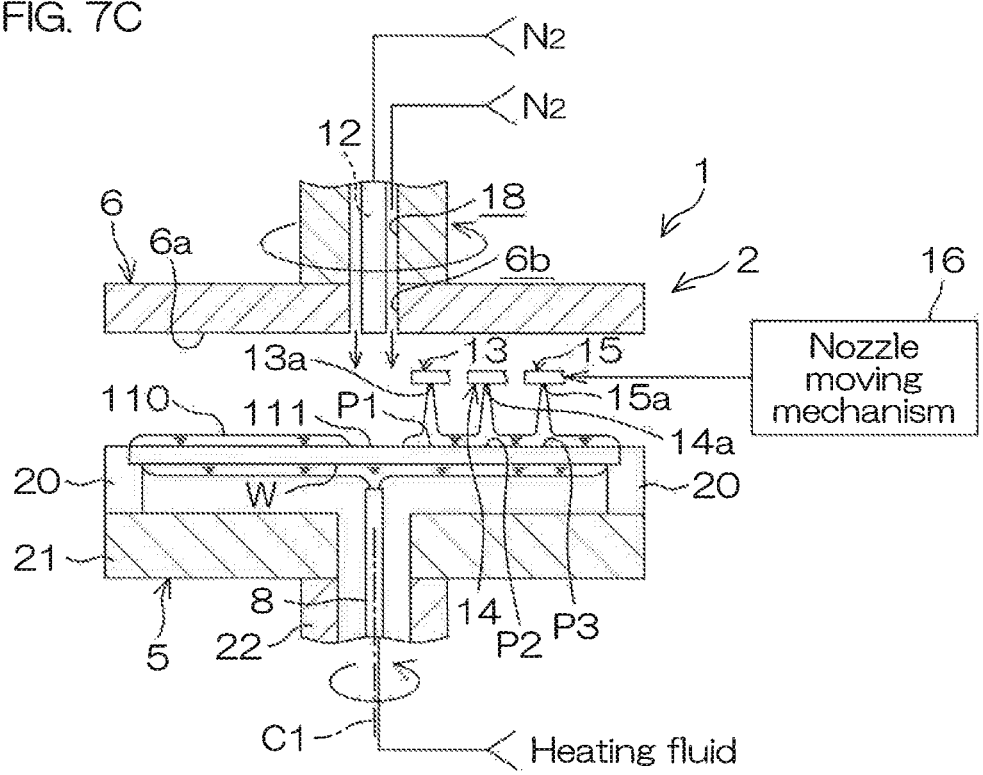

FIG. 7A to FIG. 7C are illustrative cross-sectional views of the main part of the processing unit 2, for describing the state of organic solvent processing (S4 in FIG. 5).

In the organic solvent processing, an organic solvent rinsing step T1, a liquid film forming step T2 and a liquid film removing step T3 are carried out in that order.

Referring to FIG. 6A, FIG. 6B and FIG. 7A, in the organic solvent processing (S4), the organic solvent rinsing step T1 is first carried out, in which the DIW on the upper surface of the substrate W is replaced with an organic solvent such as IPA in a state where the substrate W is being rotated.

The controller 3 closes the DIW valve 56. Supply of the DIW from the DIW nozzle 10 is thereby interrupted. The controller 3 then opens the central IPA valve 58. The IPA is thereby supplied from the central IPA nozzle 11 toward the rotating upper surface of the substrate W.

The controller 3 may control the shielding member raising/lowering mechanism 32 to maintain the shielding member 6 located at the first proximal position, and may control the guard raising/lowering mechanisms 46 to 48 to maintain the state of the space A formed by the substrate W, shielding member 6 and first guard 43. Different from this preferred embodiment, when the second guard 44 is located higher than the substrate facing position after completion of the DIW rinse processing (S3), the controller 3 may control the second guard raising/lowering mechanism 47 to move the second guard 44 to the substrate facing position.

The controller 3 controls the second inert gas valve 68 to adjust the flow rate of inert gas supplied from the inert gas flow channel 18 to 50 liter/min, for example.

The controller 3 drives the electric motor 23 to cause high-speed rotation of the spin base 21 at 2000 rpm, for example (high-speed rotation step). That is, the high-speed rotation step is carried out following the DIW rinse processing (S3). The IPA that has been supplied spreads rapidly over the entire upper surface of the substrate W by centrifugal force, and the DIW on the substrate W is replaced by the IPA. The controller 3 controls the shielding member rotating mechanism 33 to rotate the shielding member 6 at 1000 rpm, for example.

As shown in FIG. 6A, FIG. 6B and FIG. 7B, the liquid film forming step T2 in which a liquid film 110 of IPA is formed is carried out during the organic solvent processing.

Continuing supply of the IPA from the central IPA nozzle 11 to the upper surface of the substrate W forms a liquid film 110 of IPA on the upper surface of the substrate W (liquid film forming step). In order to form the liquid film 110 of IPA, the controller 3 drives the electric motor 23 to decelerate rotation of the spin base 21 to 300 rpm, for example. The controller 3 controls the shielding member rotating mechanism 33 to maintain the state of rotation of the shielding member 6 at 1000 rpm, for example.

The controller 3 controls the shielding member raising/lowering mechanism 32 to move (raise) the shielding member 6 from the first proximal position to a second proximal position, for example. When the space A has been formed, the interval between the upper surface of the substrate W and the facing surface 6a of the shielding member 6 may be adjusted while maintaining the space A (interval adjusting step). The second proximal position is the position where the facing surface 6a of the shielding member 6 is proximal to the upper surface of the substrate W, and is a position higher than the first proximal position. When the shielding member 6 is located at the second proximal position, the facing surface 6a is located higher than the facing surface 6a when the shielding member 6 is located at the first proximal position, the distance from the upper surface of the substrate W is about 15 mm.

In the interval adjusting step, the controller 3 controls the first guard raising/lowering mechanism 46 to move the first guard 43 together with the shielding member 6. This causes the shielding member 6 is thereby disposed at the shielding member facing position. As a result, the state of formation of the space A is maintained before and after the interval adjusting step. In addition, the controller 3 controls the second guard raising/lowering mechanism 47 to maintain the state where the second guard 44 is disposed at the substrate facing position.

While the liquid film 110 of IPA is being formed on the substrate W, the controller 3 controls the nozzle moving mechanism 16 to move the nozzles 13 to 15 toward the processing positions. The processing positions are the positions of each of the nozzles 13 to 15 when the first nozzle 13 is disposed at a position deviated slightly (about 40 mm, for example) from the center region of the substrate W toward the peripheral edge side of the substrate W.

In the liquid film forming step T2, supply of inert gas from the inert gas flow channel 18, that was initiated in the DIW rinse processing (S3), is maintained. The flow rate of the inert gas is 50 liter/min, for example.

As shown in FIG. 6A, FIG. 6B and FIG. 7C, in the organic solvent processing (S4), a liquid film removing step T3 is then carried out in which the liquid film 110 of IPA is removed from the upper surface of the substrate W. In the liquid film removing step T3, an opening 111 is formed in the liquid film 110 of IPA (opening-forming step), and the liquid film 110 is removed from the upper surface of the substrate W by widening the opening 111 (liquid film removal step).

Also, the controller 3 closes the central IPA valve 58 to interrupt supply of the IPA to the upper surface of the substrate W by the central IPA nozzle 11. The controller 3 then controls the second inert gas valve 68 to blow the inert gas (for example, N2 gas) perpendicularly from the inert gas flow channel 18 toward the center region of the upper surface of the substrate W at 100 liter/min, for example, and the center region of the upper surface of the substrate W is thereby exposed by opening a small opening 111 (of approximately 30 mm diameter, for example) in the center region of the liquid film 110, (opening-forming step).

The opening-forming step does not necessarily have to be carried out by blowing an inert gas. For example, the opening 111 may be formed in the center region of the liquid film 110 without blowing an inert gas, but by evaporating of the IPA in the center region by heating the substrate W by supply of a heating fluid from the lower surface nozzle 8 onto the center region of the lower surface of the substrate W. Alternatively, the opening 111 may be formed in the liquid film 110 by both blowing of the inert gas onto the upper surface of the substrate Wand heating of the center region of the lower surface of the substrate W by a heating fluid.

The opening 111 is widened by centrifugal force due to rotation of the substrate W, and the IPA liquid film 110 is gradually removed from the upper surface of the substrate W (liquid film removal step). The substrate W held on the spin base 21 is also rotated during the liquid film removal step.

That is, the substrate rotating step is carried out in parallel with the liquid film removal step.

Blowing of the inert gas by the inert gas flow channel 18 may be continued until the liquid film 110 is removed from the upper surface of the substrate W, or in other words, until the liquid film removing step has been completed. The blowing force of the inert gas promotes expansion of the opening 111 by applying force to the IPA liquid film 110. During this time, the flow rate of the inert gas may be increased in a stepwise manner. For example, for the preferred embodiment, the inert gas flow rate is maintained at 100 liter/min for a prescribed time period, then increased to a flow rate of 200 liter/min which is maintained for a prescribed time period, and then increased to a flow rate of 300 liter/min which is maintained for a prescribed time period.

Until the liquid film 110 is removed from the upper surface of substrate W, the controller 3 may also control the first inert gas valve 60 to supply the inert gas from the inert gas nozzle 12 to the center region of the upper surface of the substrate W. This further promotes widening of the opening 111.

In the liquid film removing step T3, the controller 3 may control the guard raising/lowering mechanisms 46 to 48 to maintain a state in which the first guard 43 is disposed at the shielding member facing position and the second guard 44 is disposed at the substrate facing position.

Figure 8:
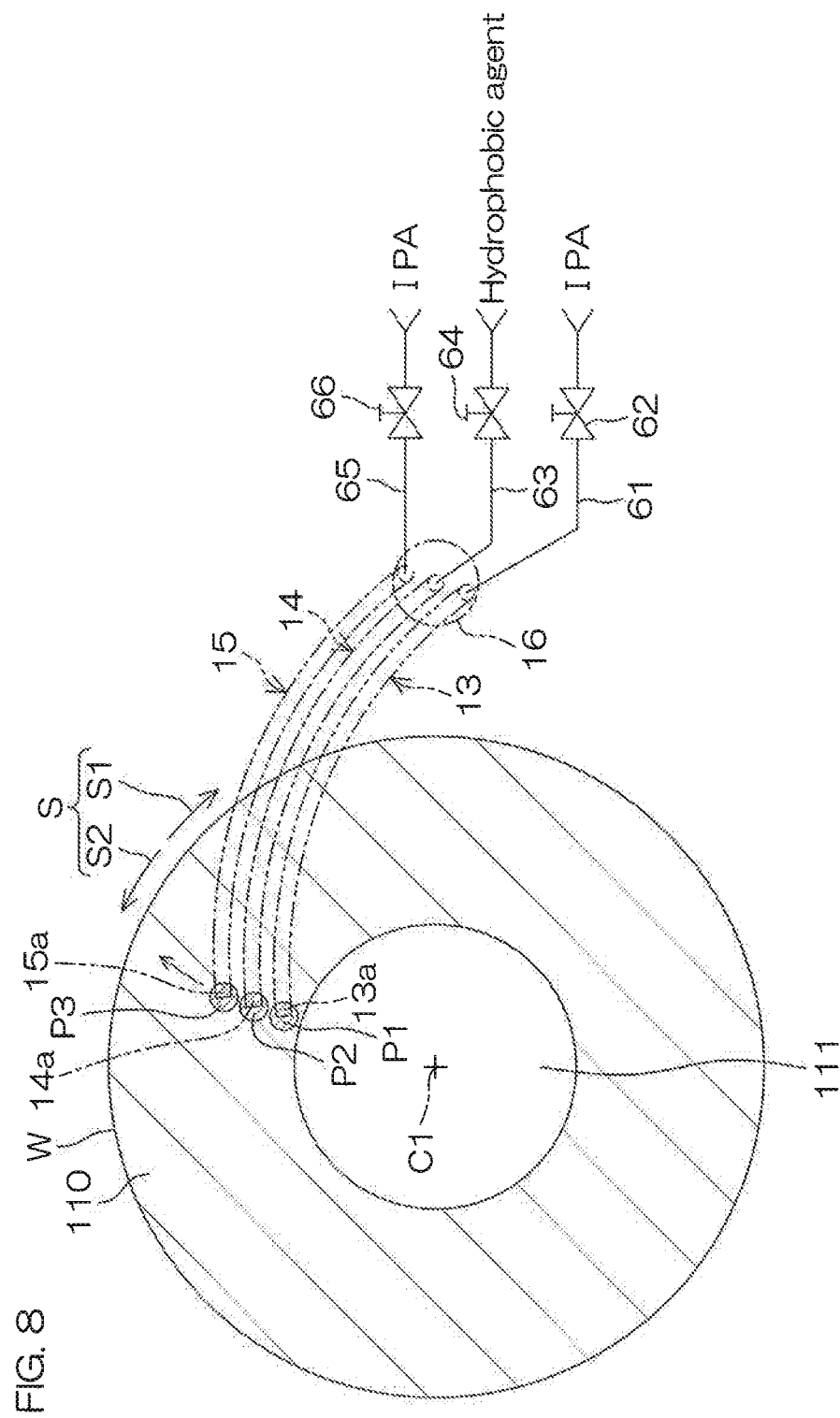
FIG. 8 is a schematic view of the substrate processing in FIG. 7C in plan view.

Next, control of the nozzles 13 to 15 in the liquid film removing step T3 will be explained in detail with reference to FIG. 8, which is a schematic view of the state of substrate processing in FIG. 7C in plan view.

When the opening 111 is widened, the controller 3 sets a first liquid landing point P1 where the low surface tension liquid such as IPA is to land on the upper surface of the substrate W. The first liquid landing point P1 is set on the outside of the opening 111. The outside of the opening 111 is the side opposite the rotational axis C1 with respect to the peripheral edge of the opening 111. The controller 3 opens the first IPA valve 62 to initiate supply of IPA from the first nozzle 13 to the first liquid landing point P1 (low surface tension liquid supply step).

Also, when the opening 111 is widened, the controller 3 sets a second liquid landing point P2 where the hydrophobic agent is to land on the upper surface of the substrate W. The second liquid landing point P2 is set on a position that is the outside of the opening 111 and is further from the opening 111 than the first liquid landing point P1. The second liquid landing point P2 is arranged with the first liquid landing point P1 along the rotational radius direction. The controller 3 opens the hydrophobic agent valve 64 to initiate supply of the hydrophobic agent from the second nozzle 14 to the second liquid landing point P2 (hydrophobic agent supply step). Here, the substrate rotational direction S is the rotational direction of the substrate W, the upstream side S1 is the upstream side in the substrate rotational direction S, and the downstream side S2 is the downstream side in the substrate rotational direction S. The first liquid landing point P1 is preferably set on the upstream side S1 more than the second liquid landing point P2.

As mentioned above, the substrate heating step is carried out continuously while the organic solvent processing (S4) is being carried out. Thus, the substrate heating step is initiated before the hydrophobic agent supply step that is initiated in the liquid film removing step T3.

Moreover, when the opening 111 is widened, the controller 3 sets a third liquid landing point P3 where the low surface tension liquid such as IPA is to land on the upper surface of the substrate W. The third liquid landing point P3 is set on the outside of the opening 111, at a location further from the opening 111 than the second liquid landing point P2. The third liquid landing point P3 is arranged with the first liquid landing point P1 and second liquid landing point P2 along the rotational radius direction. The third liquid landing point P3 is set on the downstream side S2 more than the second liquid landing point P2. The controller 3 opens the second IPA valve 66 to initiate supply of IPA from the third nozzle 15 to the third liquid landing point P3.

As the opening 111 widens, the controller 3 moves the first liquid landing point P1, the second liquid landing point P2 and the third liquid landing point P3 so as to follow widening of the opening 111 (liquid landing point moving step). Specifically, the controller 3 controls the nozzle moving mechanism 16 to move the nozzles 13 to 15 located at the processing positions, toward the peripheral edge of the substrate W, in order to make the first liquid landing point P1, second liquid landing point P2 and third liquid landing point P3 follow the widening of the opening 111. More specifically, by driving rotation of the support member 80 (see FIG. 3) around a prescribed central axis by the driving mechanism 81 (see FIG. 3), the nozzles 13 to 15 are moved to the radially outer side along the upper surface of the substrate W (nozzle moving step). The nozzle moving mechanism 16 is an example of a first liquid landing point changing unit that changes the location of the first liquid landing point P1. The nozzle moving mechanism 16 is also an example of a second liquid landing point changing unit that changes the location of the second liquid landing point P2 and an example of a third liquid landing point changing unit that changes the location of the third liquid landing point P3. By moving the nozzles 13 to 15 by the nozzle moving mechanism 16, the first liquid landing point P1 and third liquid landing point P3 move so as to follow movement of the second liquid landing point P2.

The liquid film removing step T3 is finished when the first nozzle 13 reaches an outer peripheral position, for example. The outer peripheral position is the position of the nozzles 13 to 15 when the discharge ports 13a to 15a of the nozzles 13 to 15 are facing the peripheral edge of the substrate W (locations deviated by 140 mm, for example, from the center region of the substrate W toward the peripheral edge side of the substrate W). Alternatively, the liquid film removing step T3 may be completed at the point where the peripheral edge of the opening 111 has reached the peripheral edge of the substrate W.

The third discharge port 15a of the third nozzle 15, the second discharge port 14a of the second nozzle 14 and the first discharge port 13a of the first nozzle 13 are arranged in that order from the radially outer side to the radially inner side. Therefore, the third nozzle 15 reaches the outer peripheral location before the first nozzle 13 and the second nozzle 14, and the second nozzle 14 reaches the outer peripheral position before the first nozzle 13.

When the third nozzle 15 reaches the outer peripheral location, the controller 3 closes the second IPA valve 66 to interrupt supply of IPA from the third nozzle 15. When the second nozzle 14 reaches the outer peripheral location, the hydrophobic agent valve 64 is closed to interrupt supply of hydrophobic agent from the second nozzle 14. Also, when the first nozzle 13 reaches the outer peripheral location, the controller 3 closes the first IPA valve 62 to interrupt supply of IPA from the first nozzle 13. This completes the low surface tension liquid supply step. Since the substrate heating step is carried out continuously during the organic solvent processing (S4), the substrate heating step continues until completion of the low surface tension liquid supply step.

Next, the drying processing (S5: spin drying) will be explained with reference to FIG. 6A and FIG. 6B. After the organic solvent processing (S4) ends, the drying processing (S5) for spinning off of the liquid component on the upper surface of the substrate W by centrifugal force is carried out.

Specifically, the controller 3 controls the nozzle moving mechanism 16 to cause the nozzles 13 to 15 to retreat to their retreat positions.

The controller 3 then controls the shielding member raising/lowering mechanism 32 to move the shielding member 6 to the lower position. The controller 3 further controls the second guard raising/lowering mechanism 47 and the third guard raising/lowering mechanism 48 to dispose the second guard 44 and the third guard 45 lower than the substrate facing position. In addition, the controller 3 controls the first guard raising/lowering mechanism 46 to lower the first guard 43, and dispose the first guard 43 at a position slightly higher than the lower position and slightly higher than the substrate facing position.

The controller 3 also controls the electric motor 23 to accelerate rotation of the spin base 21 in a stepwise manner. Specifically, the rotation of the spin base 21 is maintained at 500 rpm, for example, for a prescribed time period, and then accelerated to 750 rpm which is maintained for a prescribed time period, and then accelerated to 1500 rpm which is maintained for a prescribed time period. The liquid component on the substrate W is thereby spun off by centrifugal force.

The controller 3 additionally controls the shielding member rotating mechanism 33 to rotate the shielding member 6 at 1000 rpm, for example. The controller 3 controls the shielding member rotating mechanism 33 to rotate the spin base 21 and the shielding member 6 in synchronization by accelerating rotation of the shielding member 6 to 1500 rpm, at a timing such that the rotational speed of the substrate W is 1500 rpm.

Supply of inert gas from the inert gas flow channel 18 is maintained during the drying processing (S5). The flow rate of the inert gas is, for example, the same as at completion of the liquid film removing step (300 liter/min). When rotation of the substrate W is accelerated to 1500 rpm, the controller 3 controls the second inert gas valve 68 to reduce the flow rate of inert gas supplied from the inert gas flow channel 18 to 200 liter/min, for example.

The controller 3 then closes the heating fluid valve to interrupt supply of the heating fluid to the lower surface of the substrate W. The controller 3 controls the electric motor 23 to interrupt rotation of the spin chuck 5. The controller 3 also controls the shielding member raising/lowering mechanism 32 to cause the shielding member 6 to retreat to the higher position. The controller 3 additionally controls the guard raising/lowering mechanisms 46 to 48 to move the guards 43 to 45 to the lower position.

Next, the transfer robot CR enters the processing unit 2 and scoops up the substrate W that has been processed from the spin chuck 5, carrying it out of the processing unit 2 (S6). The substrate W is delivered from the transfer robot CR to the transfer robot IR, and is housed in the carrier C by the transfer robot IR.

According to the first preferred embodiment, IPA is supplied to the first liquid landing point P1 and a hydrophobic agent is supplied to the second liquid landing point P2. The second liquid landing point P2 is set on the outside of the opening 111, at a location further from the opening 111 than the first liquid landing point P1. Thus, when the first liquid landing point P1 and the second liquid landing point P2 are moved to follow the widening of the opening 111, the hydrophobic agent that has been supplied to the second liquid landing point P2 is rapidly replaced by the IPA that has been supplied to the first liquid landing point P1. Moreover, since the IPA and the hydrophobic agent can be supplied to the outside of the opening 111 while removing the liquid film 110 from the upper surface of the substrate W, it is possible to rapidly remove the IPA supplied to the first liquid landing point P1, from the upper surface of the substrate W.

In addition, the first liquid landing point P1 is moved so as to follow movement of the second liquid landing point P2, so that the hydrophobic agent that has been supplied to the second liquid landing point P2 is replaced even more rapidly by the IPA that has been supplied to the first liquid landing point P1.

Also, the first liquid landing point P1 is positioned on the upstream side S1 more than the second liquid landing point P2. Consequently, the hydrophobic agent that is supplied to the second liquid landing point P2 is rapidly replaced by the IPA that is supplied on the upstream side S1 more than the second liquid landing point P2.

In addition, the second nozzle 14 that supplies the hydrophobic agent toward the second liquid landing point P2 and the first nozzle 13 that supplies the IPA toward the first liquid landing point P1 are both commonly supported by the support member 80. Control of the locations of the first liquid landing point P1 and the second liquid landing point P2 is facilitated in comparison to the case where each of the nozzles 13 to 15 is supported by a separate member. In addition, the first nozzle 13 and the second nozzle 14 can be moved along the upper surface of the substrate W while maintaining a fixed interval between the first liquid landing point P1 and the second liquid landing point P2. Unevenness in replacement of the hydrophobic agent by the IPA can thereby be reduced in comparison to where the first nozzle 13 and second nozzle 14 are separately moved.

When supply of IPA to the liquid film 110 in the liquid film removing step T3 is insufficient, the IPA locally evaporates away before the liquid film 110 of IPA is removed by centrifugal force, and liquid film cracking and exposure of the substrate W may thereby occur. Droplets may thereby remain on the upper surface of the substrate W partially. The droplets continue to apply surface tension on the pattern on the substrate W (see FIG. 12), until they finally evaporate. Collapse of the pattern may thereby occur as a result.

However, since the IPA is supplied toward the third liquid landing point P3 set on a position that is outside the opening 111 and is further from the opening 111 than the second liquid landing point P2, liquid film cracking which is occurred by local evaporation of the liquid film 110 before the liquid film 110 is removed by widening of the opening 111, can be minimized to occur. The liquid film 110 can thereby be removed from the upper surface of the substrate W.

Furthermore, moving the third liquid landing point P3 to follow movement of the second liquid landing point P2 can further minimize liquid film cracking which is occurred by local evaporation of the liquid film 110 before the liquid film 110 is removed by widening of the opening 111.

Moreover, by supplying a low surface tension liquid such as IPA, which has affinity for both water and the hydrophobic agent, toward the third liquid landing point P3, the affinity of the upper surface of the substrate W for the hydrophobic agent is increased. The hydrophobicity of the upper surface of the substrate W by the hydrophobic agent that has been supplied to the second liquid landing point P2 can thereby be increased. The surface tension acting on the pattern of the upper surface of the substrate W (see FIG. 12) can thus be reduced.

In addition, since the substrate heating step in which the substrate W is heated is initiated before the hydrophobic agent supply step, the hydrophobic agent that has been supplied to the second liquid landing point P2 is rapidly heated. The activity of the hydrophobic agent on the substrate W can thereby be increased. By supplying the hydrophobic agent of which activity is increased, to the second liquid landing point P2, the hydrophobicity on the upper surface of the substrate W can be increased. The surface tension acting on the pattern of the upper surface of the substrate W (see FIG. 12) can thus be further reduced.

Moreover, since the substrate heating step is continued until completion of the low surface tension liquid supply step, evaporation of the IPA that has been supplied to the first liquid landing point P1 is promoted. Widening of the opening 111 is therefore also promoted. The liquid film 110 can be thereby removed from the upper surface of the substrate W rapidly.

Next, a modification example of the first preferred embodiment will be described.

Figure 9:
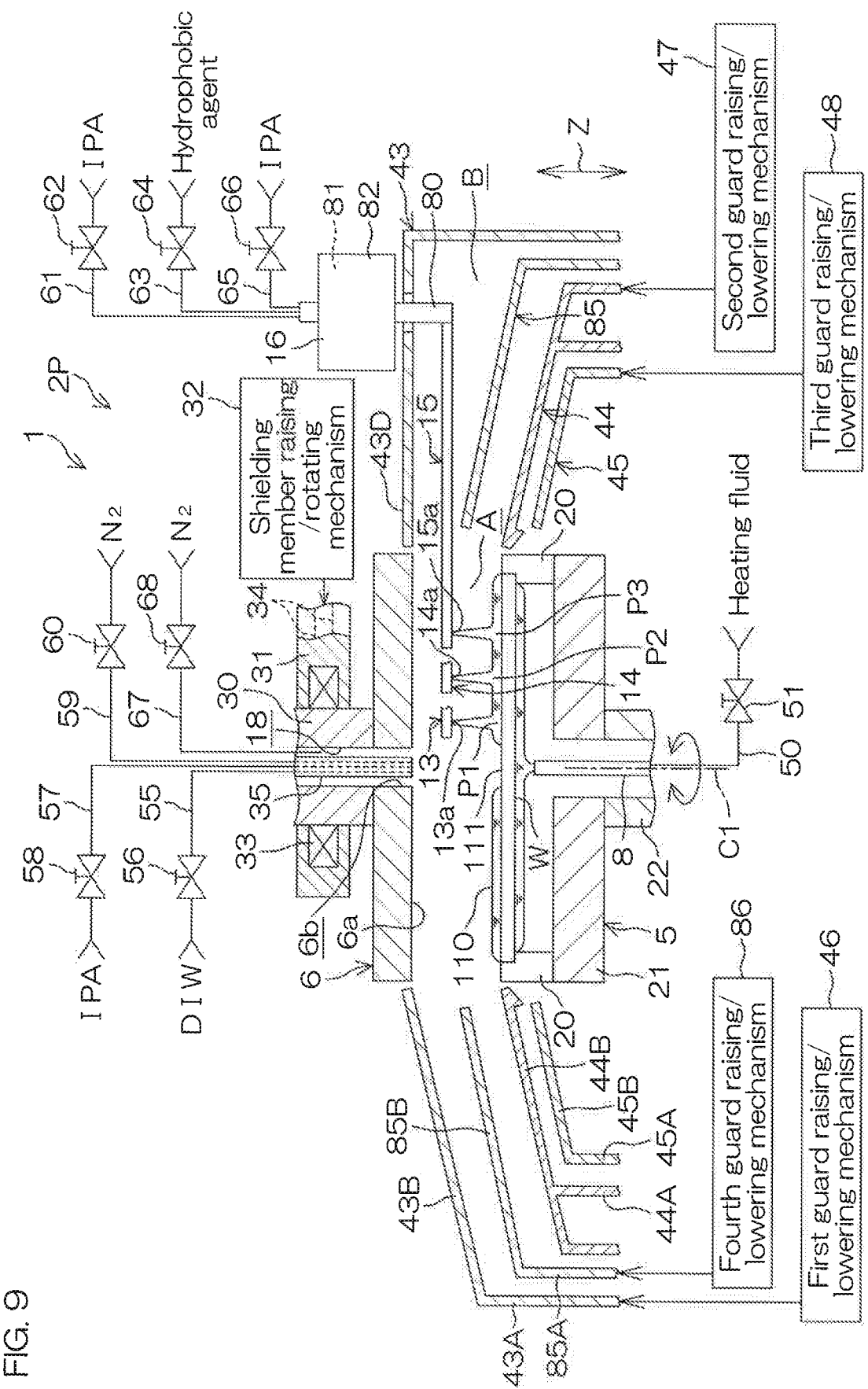
FIG. 9 is a schematic longitudinal sectional view of a processing unit according to a modification example of the first preferred embodiment.

FIG. 9 is a schematic longitudinal sectional view of a processing unit 2P according to a modification example of the first preferred embodiment. For convenience of explanation, only the members in the vicinity of the spin chuck 5 and shielding member 6 are shown in FIG. 9. In FIG. 9, the same members as those explained above are indicated by like reference numerals, and their explanation will be omitted.

The main difference between the processing unit 2P in the modification example of the first preferred embodiment shown in FIG. 9 and the processing unit 2 of the first preferred embodiment (see FIG. 3) is that the processing unit 2P further includes a fourth guard 85 that receives a processing liquid that is removed from the substrate W held on the spin chuck 5 out from the substrate W, and a fourth guard raising/lowering mechanism 86 that drives raising and lowering of the fourth guard 85. The fourth guard 85 includes a fourth cylindrical portion 85A, surrounding the spin chuck 5, further to the radially inner side than the first cylindrical portion 43A of the first guard 43 and further to the radially outer side than the second cylindrical portion 44A of the second guard 44, and a fourth extension portion 85B extending to the radially inner side from the fourth cylindrical portion 85A. The fourth extension portion 85B faces the first extension portion 43B of the first guard 43 from lower side, and faces the second extension portion 44B of the second guard 44 from upper side.

The fourth guard 85 is raised and lowered between a lower position and a higher position by the fourth guard raising/lowering mechanism 86. The lower position of the fourth guard 85 is the position of the fourth guard 85 when the upper end of the fourth guard 85 is positioned lower than the substrate W. The higher position of the fourth guard 85 is the position of the fourth guard 85 when the upper end of the fourth guard 85 is positioned higher than the substrate W. The fourth guard 85 can be positioned at a substrate facing position between the lower position and the higher position, by raising and lowering by the fourth guard raising/lowering mechanism 86. When the fourth guard 85 is positioned at the substrate facing position, the fourth extension portion 85B (its radially inner side end) faces the substrate W from the horizontal direction. The space A is partitioned from lower side by the fourth guard 85, with the fourth guard 85 positioned at the substrate facing position.

For this modification example of the first preferred embodiment, the substrate processing can be carried out as in the first preferred embodiment, and therefore it will not be explained again. In the substrate processing of this modification example, unlike the substrate processing of the first preferred embodiment, the controller 3 may control the fourth guard raising/lowering mechanism 86 in the liquid film removing step T3 to adjust the position of the fourth guard 85 to be higher than the substrate facing position. When the location of the fourth guard 85 is to be adjusted to be higher than the substrate facing position, it may be such that the nozzles 13 to 15 can pass between the fourth extension portion 85B and the first extension portion 43B of the first guard 43. Moreover, by adjusting the location of the fourth guard 85 to be higher than the substrate facing position, the IPA or hydrophobic agent that has spun off from the substrate by centrifugal force in the liquid film removing step T3 passes between the fourth extension portion 85B of the fourth guard 85 and the second extension portion 44B of the second guard 44, and is received by the fourth cylindrical portion 85A of the fourth guard 85.

According to this modification example, the same effect is exhibited as the first preferred embodiment. Also, of the liquid that is spun off from the substrate by centrifugal force, the liquid in which the hydrophobic agent is mixed may be received by the fourth guard 85 instead of the first guard 43. Fouling of the first guard 43 and the nozzles 13 to 15 by the hydrophobic agent can thereby be minimized.

Second Preferred Embodiment

Figure 10:
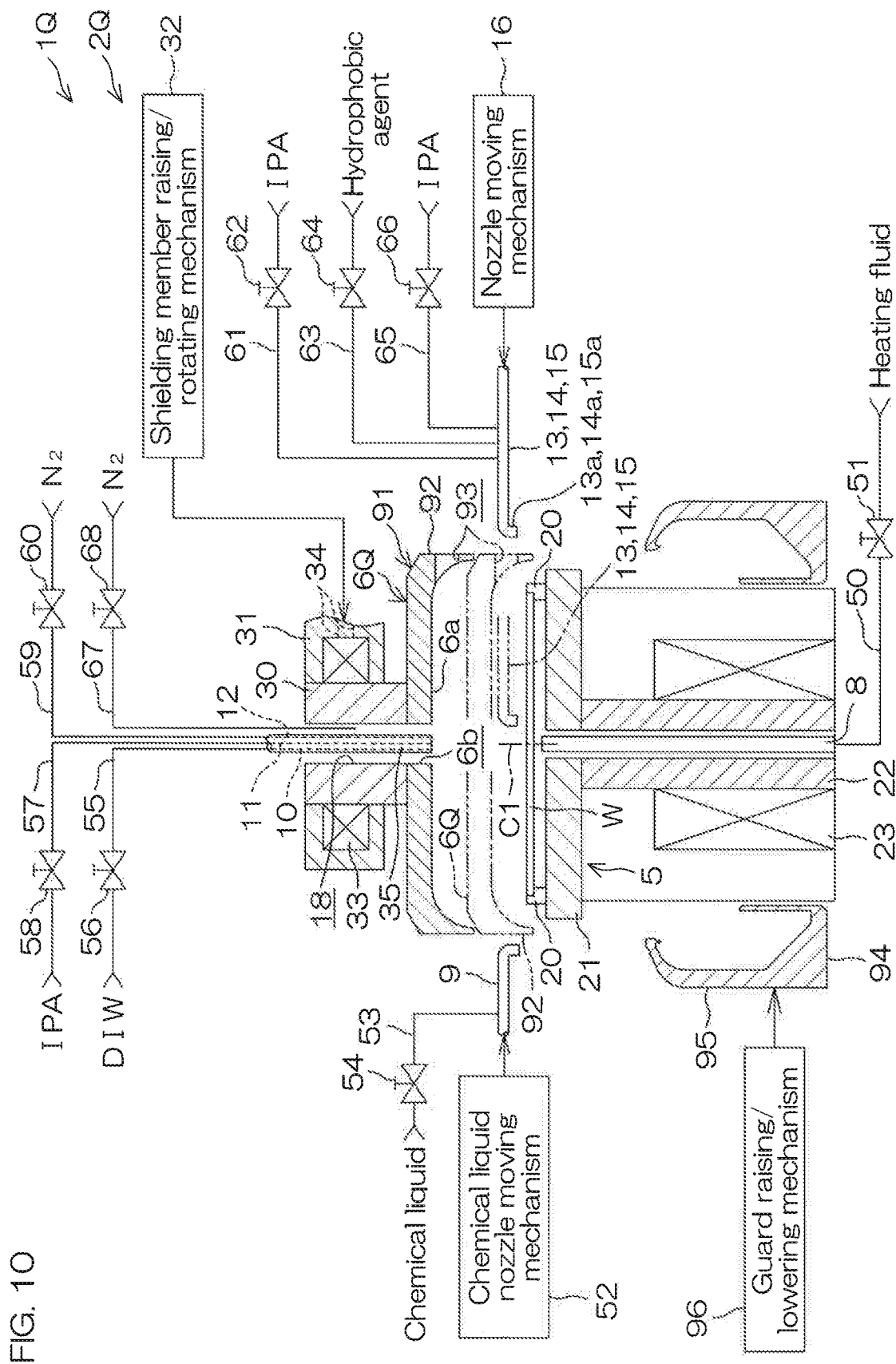
FIG. 10 is an illustrative cross-sectional view for describing of a configuration example of a processing unit in a substrate processing apparatus according to the second preferred embodiment of the present invention.

A second preferred embodiment of the present invention will now be described. FIG. 10 is an illustrative cross-sectional view for describing of a configuration example of a processing unit 2Q in a substrate processing apparatus 1Q according to the second preferred embodiment. In FIG. 10, the same members as those explained above are indicated by like reference numerals, and they will not be explained again.

The main difference between the processing unit 2Q of the second preferred embodiment shown in FIG. 10 and the processing unit 2 of the first preferred embodiment (see FIG. 3) is that the shielding member 6Q of the processing unit 2Q includes a facing member 91 that faces the upper surface of the substrate W, and an annular portion 92 that extends downward from the peripheral edge portion of the facing member 91 so as to surround the substrate W in plan view.

The facing member 91 is formed in a discoid manner. The facing member 91 is disposed essentially horizontally above the spin chuck 5. The facing member 91 has a facing surface 6a that faces the upper surface of the substrate W. A hollow shaft 30 is fixed on the side of the facing member 91 opposite the facing surface 6a.

The shielding member 6Q can be raised and lowered between a higher position and a lower position by the shielding member raising/lowering mechanism 32, similar to the shielding member 6 of the first preferred embodiment. The shielding member 6Q can be positioned at a first proximal position and a second proximal position between the higher position and lower position. When the shielding member 6Q is located at the lower position, the first proximal position or the second proximal position, the annular portion 92 faces the substrate W from the horizontal direction. When the annular portion 92 is facing the substrate W from the horizontal direction, the atmosphere between the facing surface 6a of the shielding member 6Q and the upper surface of the substrate W is shielded from the ambient atmosphere.

In the shielding member 6Q, a penetrating hole 93 penetrating the annular portion 92 in the rotational radius direction of the substrate W, is formed. The penetrating hole 93 penetrates the inner peripheral surface and the outer peripheral surface of the annular portion 92. The inner peripheral surface of the annular portion 92 of the shielding member 6Q is curved toward the radially outer side as it projects downward. The outer peripheral surface of the annular portion 92 extends along the vertical direction.

Also, the processing unit 2Q does not include the cups 41, 42, guards 43 to 45, and guard raising/lowering mechanisms 46 to 48 of the first preferred embodiment. The processing unit 2Q instead includes a cup 94, guard 95 and guard raising/lowering mechanism 96. The cup 94 surrounds the spin chuck 5. The guard 95 is formed integrally with the cup 94, and the guard 95 receives processing liquid that has been removed from the substrate W out of the substrate W that is held by the spin chuck 5. The guard raising/lowering mechanism 96 drives raising and lowering of the guard 95.

Unlike the first preferred embodiment, the discharge ports 13a to 15a of the nozzles 13 to 15 according to the second preferred embodiment respectively extend downward from the tip. Also, the nozzle moving mechanism 16 of the second preferred embodiment is disposed further to the radially outer side than the annular portion 92 of the shielding member 6Q.

The nozzles 13 to 15 can be inserted in the penetrating hole 93. When the penetrating hole 93 is positioned higher than the substrate W (for example, when the shielding member 6Q is positioned at the second proximal position), the nozzles 13 to 15 can move between the position further toward the rotational axis C1 side (the radially inner side) than the annular portion 92, and a position on the opposite side from the rotational axis C1 with respect to the annular portion 92 (the radially outer side), via the penetrating hole 93. That is, the penetrating hole 93 is provided in the annular portion 92, and functions as a passage-allowing portion to allow passage of the nozzles 13 to 15 through the annular portion 92. In FIG. 10, the nozzles 13 to 15 located at the center position, which is a position further toward the radially inner side than the annular portion 92, are indicated by alternate long and two short dash lines.

In the substrate processing apparatus 1Q of the second preferred embodiment, essentially the same substrate processing can be carried out as with the substrate processing apparatus 1 of the first preferred embodiment, except for the steps related to raising and lowering of the guards 43 to 45 (see FIG. 3), and therefore it will not be explained again. In substrate processing with the substrate processing apparatus 1Q, however, it is necessary to stop rotation of the shielding member 6Q when the nozzles 13 to 15 are passed through the penetrating hole 93 in the liquid film forming step T2 and liquid film removing step T3. Moreover, in substrate processing with the substrate processing apparatus 1Q, the guard raising/lowering mechanism 96 may be controlled to raise and lower the guard 95 so that it does not interfere with the nozzles 13 to 15.

The second preferred embodiment exhibits the same effect as the first preferred embodiment.

Third Preferred Embodiment

Figure 11:
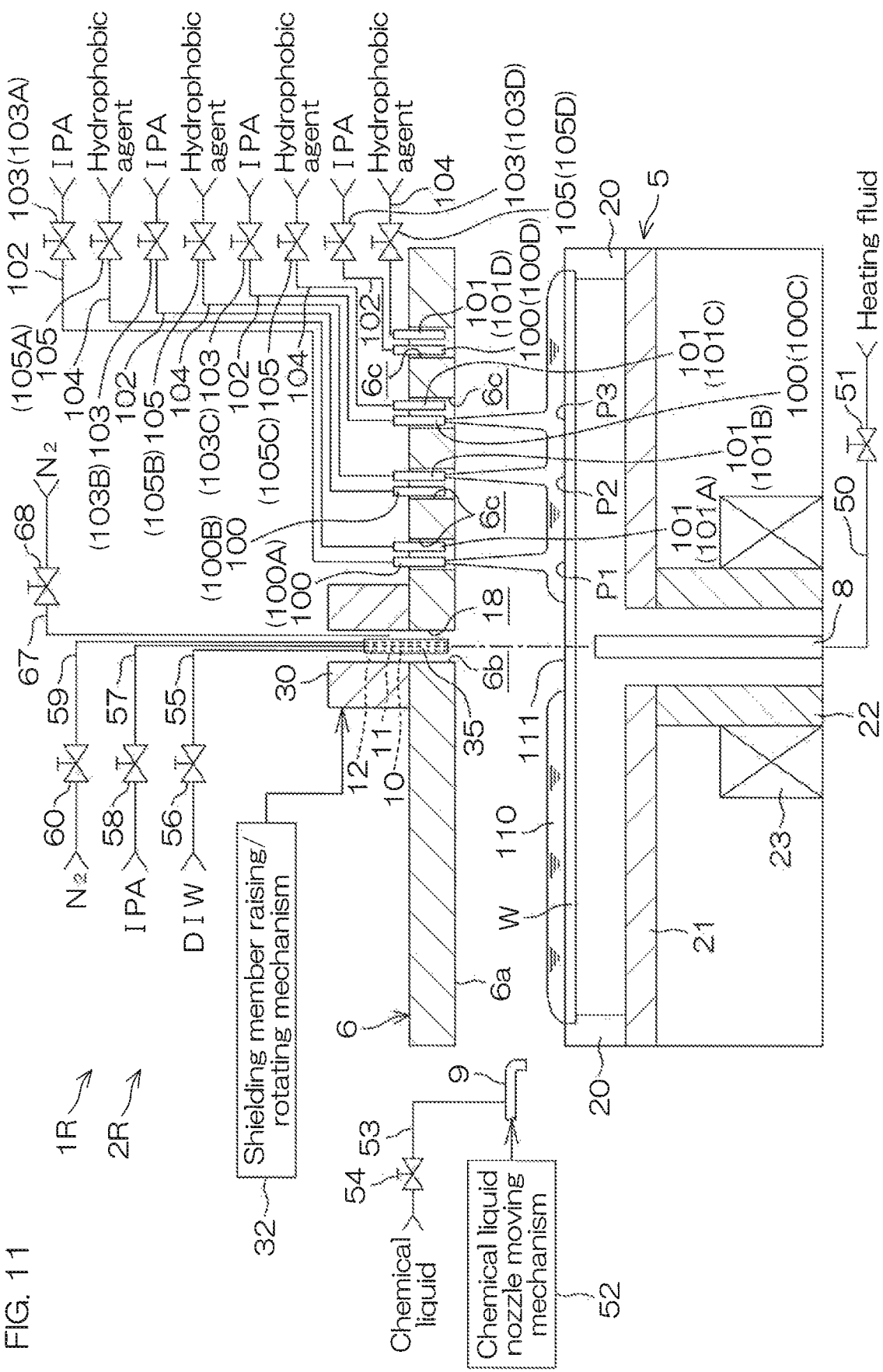
FIG. 11 is an illustrative cross-sectional view for describing of a configuration example of a processing unit in a substrate processing apparatus according to the third preferred embodiment of the present invention.

Next, a third preferred embodiment of the present invention will be described. FIG. 11 is an illustrative cross-sectional view for description of a configuration example of a processing unit 2R in a substrate processing apparatus 1R according to the third preferred embodiment of the present invention. In FIG. 11, the same members as those explained above are indicated by like reference numerals, and they will not be explained again.

The main difference between the processing unit 2R of the third preferred embodiment shown in FIG. 11 and the processing unit 2 of the first preferred embodiment (see FIG. 3) is that the processing unit 2R includes a plurality of spaced IPA nozzles 100 and a plurality of spaced hydrophobic agent nozzles 101, instead of the nozzles 13 to 15.

The plurality of spaced IPA nozzles 100 are disposed at positions at different distances from the rotational axis C1, and the plurality of spaced IPA nozzles 100 supply an organic solvent (such as IPA) toward positions at distances from the rotation center position of the upper surface of the substrate W. The plurality of spaced hydrophobic agent nozzles 101 are disposed at positions at different distances from the rotational axis C1, and they supply a hydrophobic agent toward positions at distances from the rotation center position of the upper surface of the substrate W.

For this preferred embodiment, the plurality of spaced IPA nozzles 100 are arranged along the rotational radius direction of the substrate W. The tips (discharge ports) of each of the plurality of spaced IPA nozzles 100 are housed respectively in a plurality of supply ports 6c formed in the facing surface 6a of the shielding member 6. The IPA discharged from the plurality of spaced IPA nozzles 100 is supplied to the upper surface of the substrate W through the supply ports 6c. For this preferred embodiment, the plurality of supply ports 6c are penetrating holes running through the shielding member 6 in the vertical direction Z.

A plurality of spaced IPA supply pipes 102 are respectively coupled with the plurality of spaced IPA nozzles 100, and a plurality of spaced IPA valves 103 are respectively interposed in the plurality of spaced IPA supply pipes 102. In other words, a separate spaced IPA supply pipe 102 is coupled with each spaced IPA nozzle 100, and one spaced IPA valve 103 is interposed in each of the spaced IPA supply pipes 102.

Each of the plurality of spaced IPA valves 103 configures a supply switching unit that switches the IPA supply to the corresponding spaced IPA nozzle 100 on or off. At least two spaced IPA nozzles 100 are provided, and IPA can be supplied from at least two spaced IPA nozzles 100. The controller 3 controls the plurality of spaced IPA valves 103 to change the first liquid landing point P1 to at least two positions other than the rotation center position of the upper surface of the substrate W. That is, the plurality of spaced IPA valves 103 are an example of the first liquid landing point changing unit.

For this preferred embodiment, the plurality of spaced hydrophobic agent nozzles 101 are arranged along the rotational radius direction of the substrate W. Each of the tips (discharge ports) of the plurality of spaced hydrophobic agent nozzles 101 is housed in each of a plurality of supply ports 6c. The hydrophobic agent discharged from the plurality of spaced hydrophobic agent nozzles 101 is supplied to the upper surface of the substrate W through the supply ports 6c.

For this preferred embodiment, one spaced IPA nozzle 100 and one spaced hydrophobic agent nozzle 101 are housed in each supply port 6c. Unlike this preferred embodiment, either one spaced IPA nozzle 100 or one spaced hydrophobic agent nozzle 101 alone may be housed in each supply port 6c.

A plurality of spaced hydrophobic agent supply pipes 104 are coupled with the plurality of spaced hydrophobic agent nozzles 101 respectively, and a plurality of spaced hydrophobic agent valves 105 are interposed in the plurality of spaced hydrophobic agent supply pipes 104 respectively. In other words, a individual spaced hydrophobic agent supply pipe 104 is coupled with each spaced hydrophobic agent nozzle 101, and one spaced hydrophobic agent valve 105 is interposed in each of the spaced hydrophobic agent supply pipes 104.

Each of the plurality of spaced hydrophobic agent supply pipes 104 forms a supply switching unit that switches the hydrophobic agent supply to the corresponding spaced hydrophobic agent nozzle 101 on or off. At least two spaced hydrophobic agent nozzles 101 are provided, the hydrophobic agent can be supplied from at least two spaced hydrophobic agent nozzles 101. The controller 3 controls the plurality of spaced hydrophobic agent valves 105 to change the second liquid landing point P2 to at least two locations other than the rotation center position of the upper surface of the substrate W. In other words, the plurality of spaced hydrophobic agent valves 105 are an example of the second liquid landing point changing unit.

In the substrate processing apparatus 1R of the third preferred embodiment, the substrate processing can be carried out in approximately the same as in the substrate processing apparatus 1 of the first preferred embodiment, except for the steps related to raising and lowering of the guards 43 to 45 (see FIG. 3) and rotation of the shielding member 6, however, the liquid film removing step T3 of the organic solvent processing (S4) differs.

The main difference between the organic solvent processing (S4) with the substrate processing apparatus 1R of the third preferred embodiment and the organic solvent processing (S4) with the substrate processing apparatus 1 of the first preferred embodiment is that in the liquid film removing step T3 with the substrate processing apparatus 1R, the spaced IPA nozzles 100 and spaced hydrophobic agent nozzles 101 are used instead of the nozzles 13 to 15.

In the liquid film removing step T3 with the substrate processing apparatus 1R, the opening 111 is first formed in the liquid film 110 that has been formed in the liquid film forming step T2, similar to substrate processing with the substrate processing apparatus 1 of the first preferred embodiment.

When the opening 111 is to be widened, the controller 3 sets the first liquid landing point P1 on the outside of the opening 111. The controller 3 also opens the spaced IPA valves 103 to initiate supply of a low surface tension liquid such as IPA from the corresponding spaced IPA nozzles 100 to the first liquid landing point P1 (low surface tension liquid supply step).

Moreover, when the opening 111 is to be widened, the controller 3 sets the second liquid landing point P2 at a position that is outside of the opening 111 and is further from the opening 111 than the first liquid landing point P1. The controller 3 also opens the spaced hydrophobic agent valve 105 to initiate supply of the hydrophobic agent from the second nozzle 14 to the second liquid landing point P2 (hydrophobic agent supply step). Since the second liquid landing point P2 is set on a position further from the opening 111 than the first liquid landing point P1, the controller 3 opens the spaced hydrophobic agent valve 105 corresponding to the spaced hydrophobic agent nozzle 101 located more to the radially outer side than the spaced IPA nozzle 100 that is supplying IPA to the first liquid landing point P1.

Moreover, when the opening 111 is to be widened, the controller 3 sets the third liquid landing point P3 at a position that is outside of the opening 111 and is further from the opening 111 than the second liquid landing point P2. In addition, the controller 3 opens the spaced IPA valve 103 corresponding to a spaced IPA nozzle 100 different from the spaced IPA nozzle 100 that is supplying IPA to the first liquid landing point P1, and supply of the low surface tension liquid such as IPA are thereby initiated from the corresponding spaced IPA nozzle 100 to the third liquid landing point. Since the third liquid landing point P3 is set at a position further from the opening 111 than the second liquid landing point P2, the controller 3 opens the spaced IPA valve 103 corresponding to the spaced IPA nozzle 100 positioned more to the radially outer side than the spaced hydrophobic agent nozzle 101 that is supplying the hydrophobic agent to the second liquid landing point P2.

As the opening 111 widens, the controller 3 moves the first liquid landing point P1, the second liquid landing point P2 and the third liquid landing point P3 so as to follow widening of the opening 111 (liquid landing point moving step).

In FIG. 11, the reference numerals 100A to 100D are used for denotation in order from the spaced IPA nozzle 100 nearest the rotation center position of the substrate W. The reference numerals 103A to 103D are used for denotation of the respective spaced IPA valves 103 corresponding to the spaced IPA nozzles 100A to 100D. Also in FIG. 11, the reference numerals 101A to 101D are used for denotation in order from the spaced hydrophobic agent nozzle 101 nearest the rotation center position of the substrate W. The reference numerals 105A to 105D are used for denotation of the respective spaced hydrophobic agent valves 105 corresponding to the spaced hydrophobic agent nozzles 101A to 101D.

An example of the liquid landing point moving step according to the third preferred embodiment will be explained below in detail, assuming a state in which the spaced IPA nozzle 100A is supplying IPA to the first liquid landing point P1 the spaced hydrophobic agent nozzle 101B is supplying a hydrophobic agent to the second liquid landing point P2, and the spaced IPA nozzle 100C is supplying IPA to the third liquid landing point P3, immediately after the opening 111 has been formed (the state illustrated in FIG. 11).

First, the controller 3 moves the third liquid landing point P3 to the radially outer side before the peripheral edge of the opening 111 reaches the first liquid landing point P1, in order to cause the third liquid landing point P3 to follow widening of the opening 111. Specifically, the controller 3 closes the spaced IPA valve 103C and opens the spaced IPA valve 103D to switch the spaced IPA nozzles 100 supplying IPA to the upper surface of the substrate W (from the spaced IPA nozzle 100C to the spaced IPA nozzle 100D).

The controller 3 then moves the second liquid landing point P2 to the radially outer side before the peripheral edge of the opening 111 reaches the first liquid landing point P1, in order to cause the second liquid landing point P2 to follow widening of the opening 111. Specifically, the controller 3 closes the spaced hydrophobic agent valve 105B and opens the spaced hydrophobic agent valve 105C, to switch the spaced hydrophobic agent nozzles 101 supplying the hydrophobic agent onto the upper surface of the substrate W (from the spaced hydrophobic agent nozzle 101B to the spaced hydrophobic agent nozzle 101C).

The controller 3 further moves the first liquid landing point P1 to the radially outer side before the peripheral edge of the opening 111 reaches the first liquid landing point P1, in order to cause the first liquid landing point P1 to follow widening of the opening 111. Specifically, the controller 3 closes the spaced IPA valve 103A and opens the spaced IPA valve 103B, to switch the spaced IPA nozzles 100 supplying IPA to the upper surface of the substrate W (from the spaced IPA nozzle 100A to the spaced IPA nozzle 100B).

Thus, in the liquid film removing step T3 of the third preferred embodiment, the spaced IPA nozzles 100 that supply IPA and the spaced hydrophobic agent nozzles 101 that supply the hydrophobic agent are switched to match widening of the opening 111, and the first liquid landing point P1, second liquid landing point P2 and third liquid landing point P3 can thereby be moved.

The third preferred embodiment exhibits the same effect as the first preferred embodiment.

Moreover, according to the third preferred embodiment, it is not necessary to move the nozzles between the shielding member 6 and the substrate W in the organic solvent processing (S4), and the substrate W can thereby be processed with a state where the shielding member 6 is closer to the substrate W than by the first preferred embodiment.

The present invention is not restricted to the preferred embodiments described above and may be implemented in yet other modes.

For example, although in the first preferred embodiment, the nozzles 13 to 15 were in a configuration so as to move around the rotational axis of the support member 80, the first nozzle 13 may instead be in a configuration so as to move rectilinearly in the direction in which it extends, unlike in the first preferred embodiment.

Furthermore, while the nozzles 13 to 15 in the first preferred embodiment were supported by a common support member 80, they may instead be supported by separate support members, unlike in the first preferred embodiment. Also, while the nozzles 13 to 15 of the first preferred embodiment were in a configuration so as to be moved in the horizontal direction between the upper surface of the substrate W and the facing surface 6a of the shielding member 6 by the common nozzle moving mechanism 16, they may instead be in a configuration so as to be moved in the horizontal direction by separate moving mechanisms.

In the preferred embodiments described above, the liquid landing points P1 to P3 were set in a row in the rotational radius direction, but the liquid landing points P1 to P3 may instead be set with separation at intervals in the substrate rotational direction S. In this case, for the arrangement of the first preferred embodiment, the nozzles 13 to 15 do not need to be in a row in the rotational radius direction.

Moreover, unlike the first preferred embodiment and third preferred embodiment, substrate processing may be carried out without establishing the third liquid landing point P3. In this case, the third nozzle 15 of the first preferred embodiment may be omitted.

Furthermore, for substrate processing in the first preferred embodiment, the configuration was such that the central IPA nozzle 11 supplies an organic solvent such as IPA to the center region of the upper surface of the substrate W, but instead, the third nozzle 15 may supply IPA as an organic solvent to the center region of the upper surface of the substrate W, unlike the first preferred embodiment. In this case, the central IPA nozzle 11 can be omitted.

Moreover, as long as the second liquid landing point P2 is established further from the opening 111 than the first liquid landing point P1, the first liquid landing point may be established further to the downstream side S2 than the second liquid landing point.

Also, for the preferred embodiment, the chemical liquid nozzle 9 is a moving nozzle that moves in the horizontal direction, however, it may instead be a fixed nozzle disposed so as to discharge the chemical liquid toward the center of rotation of the upper surface of the substrate W, unlike in the preferred embodiment. Specifically, the chemical liquid nozzle 9 may have a form in which the DIW nozzle 10, inert gas nozzle 12 and central IPA nozzle 11 are all inserted in the nozzle housing member 35 that has been inserted in the hollow shaft 30.

The processing unit 2 may also include a heater to heat the substrate W during the organic solvent processing. The heater may be built into the spin base 21, or built into the shielding member 6, or built into both the spin base 21 and the shielding member 6. When the substrate W is to be heated in the substrate processing, the lower surface nozzle 8, the heater built into spin base 21 or the heater built into the shielding member 6 may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2016-170171 filed on Aug. 31, 2016 at the Japan Patent Office and the entire disclosure of the application is incorporated herein by reference.

What is claimed is:

1. A substrate processing method comprising:
    a substrate holding step of holding a substrate horizontally;
    a liquid film forming step in which a low surface tension liquid having lower surface tension than water is supplied from a center nozzle to a center region of an upper surface of the horizontally held substrate to form a liquid film of the low surface tension liquid;
    an opening-forming step of forming an opening, which exposes the center region of the upper surface of the horizontally held substrate, in a center region of the liquid film;
    a liquid film removal step of removing the liquid film from the upper surface of the horizontally held substrate by widening the opening;
    a low surface tension liquid supply step of supplying a low surface tension liquid, having lower surface tension than water, from a first moving nozzle toward a first liquid landing point which is set on the outside of the opening;
    a hydrophobic agent supply step of supplying a hydrophobic agent, that renders the upper surface of the horizontally held substrate hydrophobic, from a second moving nozzle toward a second liquid landing point which is set on the outside of the opening and further from the opening than the first liquid landing point; and
    a liquid landing point moving step of moving the first liquid landing point and the second liquid landing point so as to follow the widening of the opening by moving the first moving nozzle and the second moving nozzle toward a peripheral edge of the horizontally held substrate,
    wherein the supply of the low surface tension liquid from the first moving nozzle toward the first liquid landing point and the supply of the hydrophobic agent from the second moving nozzle toward the second liquid landing point are started simultaneously, and
    the supply of the low surface tension liquid from the first moving nozzle toward the first liquid landing point and the supply of the hydrophobic agent from the second moving nozzle toward the second liquid landing point are started either simultaneously with formation of the opening or during widening of the opening.

2. The substrate processing method according to claim 1, wherein the liquid landing point moving step includes a step of moving the first liquid landing point so as to follow movement of the second liquid landing point.

3. The substrate processing method according to claim 1, further comprising a substrate rotating step of rotating the horizontally held substrate in parallel with the liquid film removal step;
    wherein the first liquid landing point is set so as to be positioned on the upstream side in the substrate rotational direction more than the second liquid landing point.

4. The substrate processing method according to claim 1, wherein the liquid landing point moving step includes a nozzle moving step in which a support member, that commonly supports both the first moving nozzle that supplies the low surface tension liquid toward the first liquid landing point and the second moving nozzle that supplies the hydrophobic agent toward the second liquid landing point, is driven to move the first moving nozzle and the second moving nozzle along the upper surface of the horizontally held substrate.

5. The substrate processing method according to claim 1, further comprising a step of supplying a low surface tension liquid having lower surface tension than water toward a third liquid landing point set on the outside of the opening at a position further from the opening than the second liquid landing point.

6. The substrate processing method according to claim 5, wherein the liquid landing point moving step includes a step of moving the third liquid landing point so as to follow movement of the second liquid landing point.

7. The substrate processing method according to claim 1, further comprising a substrate heating step of heating the horizontally held substrate;
    wherein the substrate heating step is initiated before the hydrophobic agent supply step.

8. The substrate processing method according to claim 7, wherein the substrate heating step is continued until completion of the low surface tension liquid supply step.

* * * * *